United States Patent
Kato et al.

(10) Patent No.: US 10,586,693 B2
(45) Date of Patent: Mar. 10, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventors: Masahiko Kato, Kyoto (JP); Katsuhiko Miya, Kyoto (JP); Hiroyuki Yashiki, Kyoto (JP)

(73) Assignee: SCREEN Holdings Co., Ltd. (JP)

(*) Notice: Subject to any disclaimer, the term of this patent is extended or adjusted under 35 U.S.C. 154(b) by 240 days.

(21) Appl. No.: 15/629,214

(22) Filed: Jun. 21, 2017

(65) Prior Publication Data

US 2017/0287700 A1    Oct. 5, 2017

Related U.S. Application Data

(62) Division of application No. 14/332,840, filed on Jul. 16, 2014, now abandoned.

(30) Foreign Application Priority Data

Jul. 16, 2013  (JP) ................................. 2013-147433
Jul. 16, 2013  (JP) ................................. 2013-147434

(51) Int. Cl.
    *H01L 21/02*  (2006.01)
    *H01L 21/67*  (2006.01)
    (Continued)

(52) U.S. Cl.
    CPC .......... *H01L 21/02052* (2013.01); *B08B 3/10* (2013.01); *B08B 7/0014* (2013.01); *H01L 21/6715* (2013.01)

(58) Field of Classification Search
    None
    See application file for complete search history.

(56) References Cited

U.S. PATENT DOCUMENTS

4,871,417 A * 10/1989 Nishizawa ................ G03F 7/40
                                                    438/748
7,364,626 B2    4/2008 Hirose et al. .................... 134/2
(Continued)

FOREIGN PATENT DOCUMENTS

JP    2009-254965    11/2009
JP    2012-018962    1/2012
(Continued)

OTHER PUBLICATIONS

Office Action dated Nov. 12, 2015 in corresponding Taiwanese Patent Application No. 103120383.
(Continued)

*Primary Examiner* — Eric W Golightly
*Assistant Examiner* — Arlyn I Rivera-Cordero
(74) *Attorney, Agent, or Firm* — Ostrolenk Faber LLP

(57) ABSTRACT

A substrate processing apparatus comprises: a liquid film former which forms a liquid film by supplying a liquid on an upper surface of the substrate W held horizontally; a cooling gas discharge nozzle which discharges cooling gas of a temperature lower than a freezing point of the liquid forming the liquid film to the liquid film; a thawing liquid discharge nozzle which discharges a thawing liquid to a frozen film formed by freezing the liquid film; a thawing liquid supplier which supplies the heated thawing liquid to the thawing liquid discharge nozzle via a pipe; and a receiver which receives the cooling gas and the thawing liquid respectively discharged from the cooling gas discharge nozzle and the thawing liquid discharge nozzle at the respective retracted position and guides the cooling gas and the thawing liquid to a common flow passage.

4 Claims, 11 Drawing Sheets

(51) Int. Cl.
*B08B 3/10* (2006.01)
*B08B 7/00* (2006.01)

(56) References Cited

U.S. PATENT DOCUMENTS

| | | | |
|---|---|---|---|
| 7,604,013 B2 | 10/2009 | Nakamura et al. | 134/95.2 |
| 7,976,896 B2 | 7/2011 | Fukuda et al. | 427/240 |
| 8,029,622 B2 | 10/2011 | Miya et al. | 134/4 |
| 2008/0121252 A1* | 5/2008 | Miya | B08B 3/10 |
| | | | 134/4 |
| 2010/0024847 A1 | 2/2010 | Breese | 134/25.4 |
| 2010/0307543 A1 | 12/2010 | Sekiguchi et al. | 134/94.1 |
| 2012/0175819 A1 | 7/2012 | Miya et al. | 264/334 |
| 2013/0020284 A1 | 1/2013 | Osada | 216/57 |
| 2015/0020850 A1 | 1/2015 | Kato et al. | 134/4 |

FOREIGN PATENT DOCUMENTS

| | | |
|---|---|---|
| JP | 2012-204559 | 10/2012 |
| JP | 2013-030612 | 2/2013 |

OTHER PUBLICATIONS

U.S. Office Action dated Dec. 27, 2016 for Related Application No. 14/332,909 (Our Ref: 4178-95), including provisional non-statutory double patenting rejection over the present application.

* cited by examiner

F I G. 6
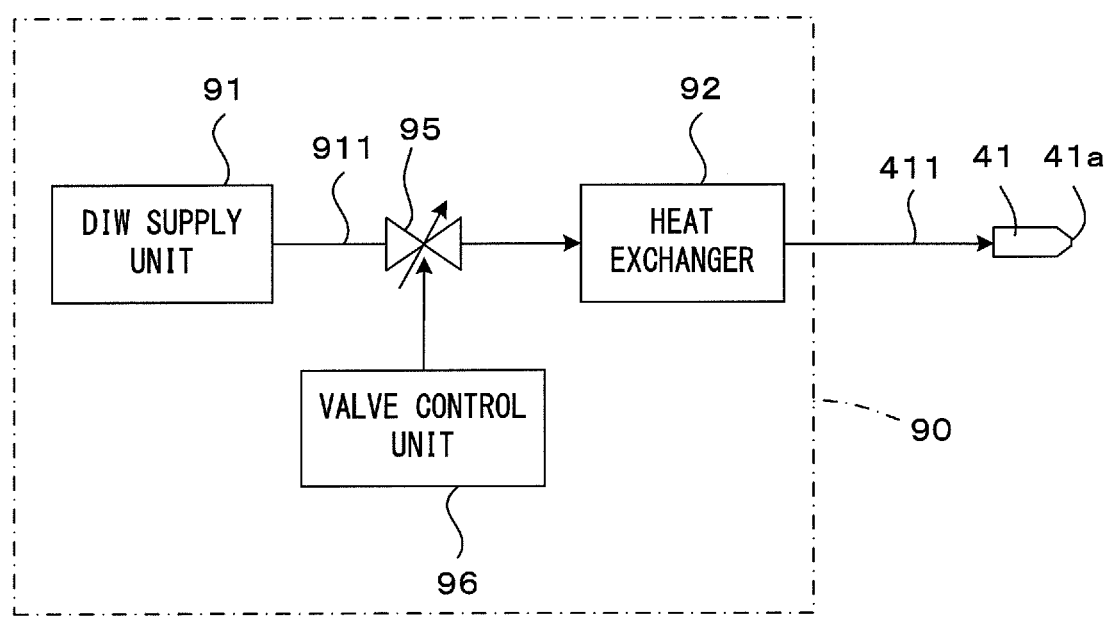

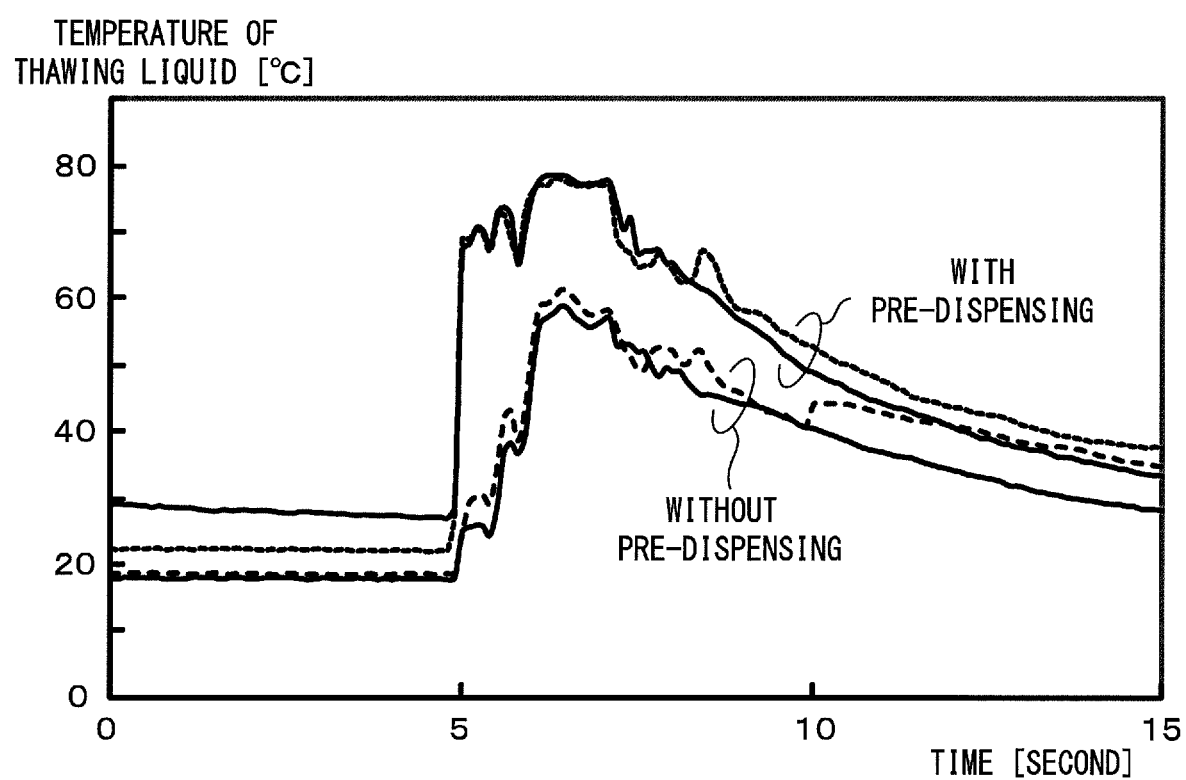

SUBSTRATE PROCESSING APPARATUS AND SUBSTRATE PROCESSING METHOD

CROSS REFERENCE TO RELATED APPLICATION

This application is a divisional of U.S. patent application Ser. No. 14/332,840, filed Jul. 16, 2014, which claims the benefit of Japanese Patent Application Nos. 2013-147433, filed Jul. 16, 2013, and 2013-147434, filed Jul. 16, 2013, which are all incorporated herein by reference.

BACKGROUND OF THE INVENTION

1. Field of the Invention

This invention relates to a substrate processing apparatus and a substrate processing method for processing a substrate by forming a liquid film on a substrate, freezing the liquid film and thawing the frozen film.

2. Description of the Related Art

A freeze cleaning technology has been and is being studied as a cleaning technology for removing extraneous matters such as particles adhering to a substrate. This technology is for separating extraneous matters utilizing a volumetric change when a liquid is frozen by forming a liquid film on a surface of a substrate as an object to be processed, freezing the liquid film and thawing the frozen film.

In this technology, proposals for further improving removal efficiency of extraneous matters have been conventionally made. For example, in a technology (first conventional technology) described in JP2012-204559A, a liquid film on a substrate is frozen by supplying low-temperature cooling gas to the liquid film from a nozzle which is scanned and moved along the upper surface of the substrate. In this conventional technology, the cooling gas discharge nozzle positioned at a standby position above and retracted from the substrate continuously supplies the cooling gas at a low flow rate, whereby gas of a sufficiently low temperature can be supplied to the liquid film on the substrate from the beginning. At this time, the gas discharged from the nozzle is guided to an exhaust path to be collected. This prevents the occurrence of water marks caused by the cooling of mist in an ambient atmosphere of the substrate by the cooling gas.

Further, in such a freeze cleaning technology, it is required to shorten a time required to freeze the liquid film in order to improve the throughput of a substrate process. To this end, a cold liquid, which is a cooled liquid, is supplied to a nozzle and a slow leak part branched off at an intermediate position of a pipe for supplying the cold liquid to the nozzle is provided in a technology (second technology) described in JP2009-254965A. A slow leak process for causing the cold liquid to flow out from the pipe via the slow leak part is performed before a liquid film is formed. By this, it can be suppressed that the cold liquid remaining in the pipe is warmed by the ambient atmosphere, and the liquid film can be formed by the cold liquid whose temperature rise is suppressed. Thus, a time required to freeze the liquid film can be shortened by setting the temperature of the liquid film at a low temperature.

In the above first conventional technology, a high-humidity atmosphere is set around the substrate by using the liquid such as water for the process. A liquid component having entered a flow passage for exhausting the cooling gas may be frozen by the flow of the cooling gas and clog the flow passage. Further, to thaw and remove the frozen film formed by freezing the liquid film, a rinsing liquid of a normal temperature is supplied to the substrate. Thus, the frozen film may not be thawed in a short time and the partly remaining frozen film may move on the substrate to damage the substrate. However, these problems are not dealt with in the above conventional technology.

Further, in the second conventional technology, only the cold liquid in the pipe upstream of a branching point where the slow leak part is branched off from the pipe flows out by the slow leak process. Thus, the cold liquid in the pipe downstream of the branching point and in the nozzle is retained and this cold liquid may be warmed by the ambient atmosphere. Then, the cold liquid initially discharged from the nozzle at the time of forming a liquid film is warmed in the pipe downstream of the branching point and in the nozzle to increase the temperature of the liquid film in some cases. As a result, it requires more time to freeze the liquid film and there has been a room for improvement from the viewpoint of improving throughput in the above conventional technology.

SUMMARY OF THE INVENTION

This invention was developed in view of the above problems and a first object thereof is to prevent the clogging of a flow passage for cooling gas and prevent damages on a substrate caused by a frozen film in a substrate processing apparatus and a substrate processing method for processing a substrate by forming a liquid film on a substrate, freezing the liquid film and thawing the frozen film. Further, a second object thereof is to improve throughput by shortening a time required to freeze a liquid film.

An aspect of a substrate processing apparatus according the present invention, to achieve the first object above, comprises: a substrate holder which holds a substrate in a horizontal posture; a liquid film former which forms a liquid film by supplying a liquid on an upper surface of the substrate held by the substrate holder; a cooling gas discharge nozzle which moves between a facing position facing the upper surface of the substrate held by the substrate holder and a retracted position laterally retracted from the upper surface of the substrate and discharges cooling gas of a temperature lower than a freezing point of the liquid forming the liquid film to the liquid film; a thawing liquid discharge nozzle which moves between a facing position facing the upper surface of the substrate held by the substrate holder and a retracted position laterally retracted from the upper surface of the substrate and discharges a thawing liquid to a frozen film formed by freezing the liquid film; a thawing liquid supplier which supplies the thawing liquid which is heated to the thawing liquid discharge nozzle via a pipe; and a receiver which receives the cooling gas discharged from the cooling gas discharge nozzle at the retracted position of the cooling gas discharge nozzle and the thawing liquid discharged from the thawing liquid discharge nozzle at the retracted position of the thawing liquid discharge nozzle and guides the cooling gas and the thawing liquid to a common flow passage.

An aspect of a substrate processing method according to the present invention, to achieve the first object above, comprises: a holding step of holding a substrate in a horizontal posture; a liquid film forming step of forming a liquid film by supplying a liquid to an upper surface of the substrate; a freezing step of freezing the liquid film by discharging cooling gas of a temperature lower than a freezing point of the liquid forming the liquid film to the liquid film by a cooling gas discharge nozzle facing the upper surface of the substrate; and a thawing step of discharging a heated thawing liquid supplied from a thawing liquid supplier via a pipe by a thawing liquid discharge nozzle facing the upper surface of the substrate and thawing a frozen film formed by freezing the liquid film, wherein: prior to the freezing step, the cooling gas in the pipe is discharged by the cooling gas discharge nozzle located at a retracted position laterally retracted from the upper surface of the substrate; prior to the thawing step, the thawing liquid in the pipe is discharged by the thawing liquid discharge nozzle located at a retracted position laterally retracted from the upper surface of the substrate; and the cooling gas discharged from the cooling gas discharge nozzle at the retracted position of the cooling gas discharge nozzle and the thawing liquid discharged from the thawing liquid discharge nozzle at the retracted position of the thawing liquid discharge nozzle flow into a common flow passage.

In these inventions, the thawing liquid discharge nozzle located at the facing position facing the substrate upper surface discharges the heated thawing liquid supplied from the thawing liquid supplier to the frozen film. This enables the frozen film to be thawed and removed in a short time. At this time, there is a possibility that the thawing liquid of a reduced temperature remains in the pipe leading to the thawing liquid discharge nozzle from the thawing liquid supplier. If such a thawing liquid of a reduced temperature is supplied to the frozen film, the progress of thawing is delayed and the partly remaining frozen film may damage the substrate. In the invention, the thawing liquid discharge nozzle can supply the thawing liquid to the frozen film at the facing position after discharging the thawing liquid in the pipe at the retracted position in advance. Since this enables the frozen film to be quickly thawed by supplying the thawing liquid of a sufficiently high temperature from the beginning, the process is possible while preventing damages on the substrate.

On the other hand, the cooling gas for freezing the liquid film can also be discharged from the cooling gas discharge nozzle at the retracted position prior to the discharge toward the liquid film. By doing so, it is possible to suppress a temperature rise of the cooling gas in the flow path leading to the cooling gas discharge nozzle and freeze the liquid film in a short time by supplying the cooling gas of a sufficiently low temperature to the liquid film from the beginning. In this case, as described above, the flow passage for the cooling gas discharged from the cooling gas discharge nozzle at the retracted position may be clogged with the frozen liquid component as described above. However, by allowing the thawing liquid to flow in the same flow passage, such clogging of the flow passage can be prevented or solved.

As just described, in the invention, the cooling gas discharge nozzle discharges the cooling gas at the retracted position in advance, whereby the liquid film on the substrate can be frozen in a short time. Further, the thawing liquid discharge nozzle discharges the thawing liquid at the retracted position in advance, whereby the frozen film can be quickly thawed by supplying the thawing liquid of a high temperature from the beginning. Thus, damages on the substrate caused by the partly remaining frozen film can be prevented. By allowing the cooling gas discharged from the cooling gas discharge nozzle and the thawing liquid discharged from the thawing liquid discharge nozzle at the respective retracted positions to flow in the common flow passage, the clogging of the flow passage can also be prevented.

Note that, in the invention, the "retracted position" of the cooling gas discharge nozzle and that of the thawing liquid discharge nozzle do not necessarily indicate the same position. Specifically, the retracted position corresponding to the cooling gas discharge nozzle and that corresponding to the thawing liquid discharge nozzle can be individually set.

An another aspect of a substrate processing apparatus according the present invention, to achieve the second object above, comprises: a substrate holder which holds a substrate in a horizontal posture; a cold liquid discharge nozzle which discharges a cold liquid, which is a cooled liquid, supplied from a cold liquid supplier via a pipe from a discharge port; a switcher which switches a discharged state of the cold liquid from the discharge port between a preliminary discharged state where the cold liquid is discharged from the discharge port without being supplied to the substrate held by the substrate holder and a liquid film forming state where the cold liquid is discharged from the discharge port to the substrate held by the substrate holder to form a liquid film of the cold liquid on the substrate; a cooling gas discharge nozzle which discharges cooling gas of a temperature lower than a freezing point of the cold liquid toward the liquid film; and a remover which removes a frozen film formed by freezing the liquid film from the substrate.

An another aspect of a substrate processing method according the present invention, to achieve the second object above, comprises: a holding step of holding a substrate in a horizontal posture; a preliminary discharging step of discharging a cold liquid, which is a cooled liquid, supplied from a cold liquid supplier via a pipe from a discharge port of a cold liquid discharge nozzle without being supplied to the substrate; a liquid film forming step of forming a liquid film of the cold liquid on the substrate by discharging the cold liquid onto the substrate from the discharge port after the preliminary discharging step; a freezing step of freezing the liquid film to form a frozen film by discharging cooling gas of a temperature lower than a freezing point of the cold liquid to the liquid film by a cooling gas discharge nozzle; and a removing step of removing the frozen film from the substrate.

According to the invention, it is possible to perform a series of substrate processes of removing the frozen film formed by freezing the liquid film after the liquid film is formed by discharging the cold liquid supplied from the cold liquid supplier via the pipe from the discharge port of the cold liquid discharge nozzle onto the substrate. Here, the cold liquid discharge nozzle not only supplies the cold liquid discharged from the discharge port onto the substrate, but also discharges the cold liquid in a mode where the cold liquid is not supplied onto the substrate. Thus, the cold liquid can be allowed to flow in the pipe and the cold liquid discharge nozzle before the liquid film is formed by discharging the cold liquid from the discharge port without supplying the cold liquid onto the substrate before the discharge of the cold liquid onto the substrate is started to form the liquid film. As a result, it is suppressed that the cold liquid is retained and warmed in the pipe and the cold liquid discharge nozzle. In discharging the cold liquid onto the substrate to form the liquid film, the cold liquid of a low temperature whose temperature rise is suppressed is discharged from an initial stage. Therefore, it is possible to form the liquid film of a low temperature on the substrate and improve throughput by shortening a time required to freeze the liquid film.

According to this invention, it is possible to supply the cooling gas of a sufficiently low temperature to the liquid film from the beginning and freeze the liquid film in a short time by discharging the cooling gas at the retracted position prior to the discharge of the cooling gas to the liquid film on the substrate by the cooling gas discharge nozzle. Further, it is possible to discharge the thawing liquid of a reduced temperature in the pipe, supply the thawing liquid of a sufficiently high temperature to the frozen film from the beginning and thaw the frozen film in a short time by discharging the thawing liquid at the retracted position prior to the thawing of the frozen film by the thawing liquid discharge nozzle. In this way, damages on the substrate are prevented. By allowing the cooling gas and the thawing liquid discharged at the retracted positions to flow in the common flow passage, clogging due to the freezing of the liquid in the flow passage can be prevented. Further, when the cold liquid discharge nozzle discharges the cold liquid onto the substrate to form the liquid film, the cold liquid of a low temperature whose temperature rise is suppressed is discharged from an initial stage. Therefore, it is possible to form the liquid film of a low temperature on the substrate and improve throughput by shortening a time required to freeze the liquid film.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 6 is a block diagram showing the configuration of the low-temperature DIW supply unit.

FIG. 8 is a graph showing a temperature change of the thawing liquid discharged from the high-temperature DIW discharge nozzle.

DETAILED DESCRIPTION OF THE PREFERRED EMBODIMENTS

Figure 1:
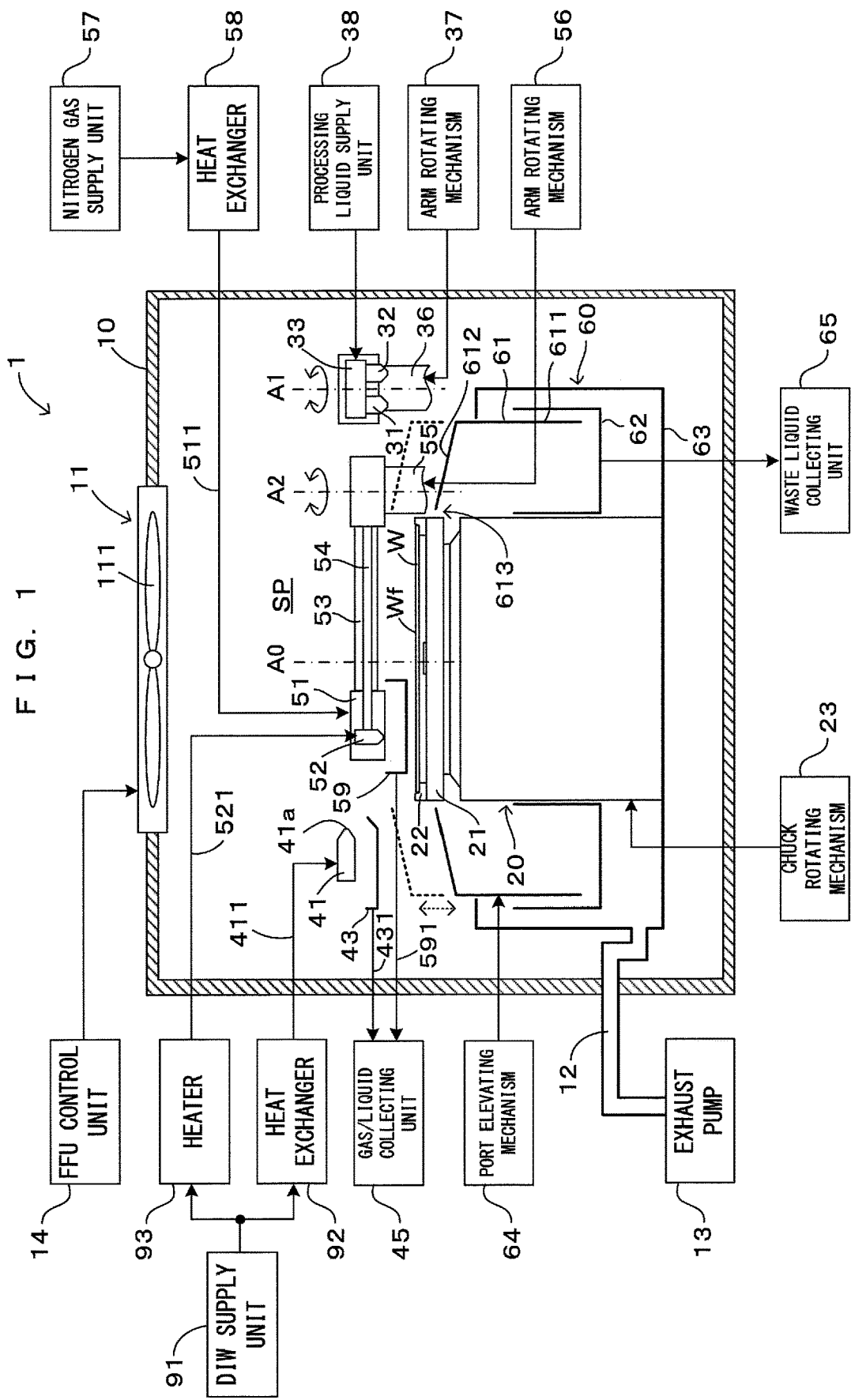
FIG. 1 is a side view diagrammatically showing one embodiment of a substrate processing apparatus according to the invention.
Figure 2:
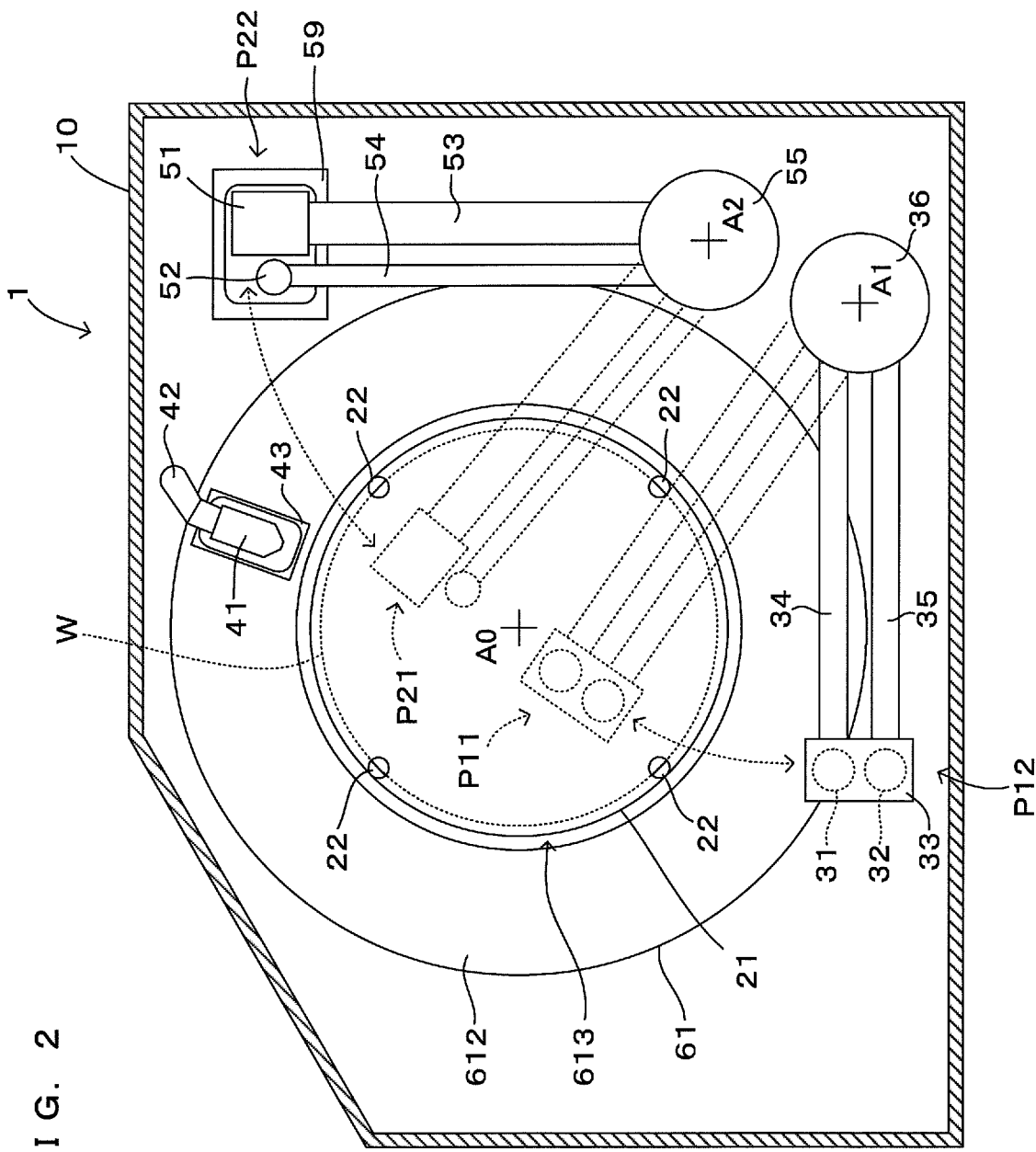
FIG. 2 is a plan view showing the arrangement and moving modes of nozzles.

FIG. 1 is a side view diagrammatically showing one embodiment of a substrate processing apparatus according to the invention. FIG. 2 is a plan view showing the arrangement and moving modes of nozzles. This substrate processing apparatus 1 functions as a single-wafer substrate cleaning apparatus capable of performing a substrate cleaning process to remove extraneous matters such as particles adhering to a surface (pattern forming surface) Wf of a substrate W such as a semiconductor wafer. More specifically, this substrate processing apparatus 1 performs a freeze cleaning process of removing extraneous matters adhering to the substrate W together with a frozen film by removing the frozen film after forming a liquid film on the surface Wf of the substrate W and freezing the liquid film as the substrate cleaning process.

The substrate processing apparatus 1 includes a processing chamber 10 internally provided with a processing space SP in which a cleaning process is applied to the substrate W. A spin chuck 20 for rotating the substrate W while holding the substrate W substantially horizontally with the substrate surface Wf faced up is arranged in the processing chamber 10. A series of substrate processes to be described later are performed on the substrate W held by the spin chuck 20.

An FFU (fan filter unit) 11 for supplying clean gas to the processing space SP in the processing chamber 10 is provided in a central part of the upper surface of the processing chamber 10. The FFU 11 takes in the outside atmosphere of the processing chamber 10 by a fan 111, collects and cleans fine particles and the like in the atmosphere by a built-in filter (not shown) and supplies clean air into the processing space SP. Accordingly, the processing space SP is kept in a clean atmosphere and an air flow (down flow) from an upper side toward a lower side is generated in the processing space SP. Since this causes airborne droplet, mist and the like of a liquid generated during the substrate cleaning process to be swept away to the lower side of the processing space SP, the adhesion thereof to the substrate W is suppressed. The operation of the FFU 11 is controlled by an FFU control unit 14. For example, the FFU control unit 14 can change a flow rate and a flow velocity of gas supplied to the processing space SP via the FFU 11 by controlling a rotation speed of the fan 111.

The spin chuck 20 arranged in the processing space SP includes a disc-shaped spin base 21 in an upper end part. The spin base 21 has a diameter equal to or slightly larger than that of the substrate W, and a plurality of chuck pins 22 for gripping a peripheral edge part of the substrate W are provided in a peripheral edge part. Each chuck pin 22 includes a supporting part for supporting the peripheral edge part of the substrate W from below and a holding part for holding the substrate W by coming into contact with an outer peripheral end surface of the substrate W supported by the supporting part. Each chuck pin 22 supports the substrate W from below and holds the substrate W from a lateral side, whereby the substrate W is held substantially in a horizontal posture while being spaced apart from the upper surface of the spin base 21. A chuck rotating mechanism 23 can rotate the spin base 21 and change a rotation speed of the spin base 21. The chuck rotating mechanism 23 rotates the spin base 21 at a suitable rotation speed, whereby the substrate W can be rotated at a desired rotation speed about a center of rotation A0.

A plurality of types of nozzles for performing each process to be described later on the substrate W held by the spin chuck 20, i.e. a chemical discharge nozzle 31 for discharging chemical such as hydrofluoric acid, a rinsing liquid discharge nozzle 32 for discharging a rinsing liquid such as DIW (deionized water), a low-temperature DIW discharge nozzle 41 for discharging low-temperature DIW, a cooling gas discharge nozzle 51 for discharging low-temperature nitrogen gas and a high-temperature DIW discharge nozzle 52 for discharging high-temperature DIW are provided in the processing chamber 10. A configuration relating to each nozzle is described in detail below. Note that although an arm for supporting each nozzle and a pipe for supplying a fluid to each nozzle are separately shown in the following description, a fluid may flow in a pipe provided in or integrally to an arm.

The chemical discharge nozzle 31 can perform a chemical process on the substrate W by discharging the chemical supplied from a processing liquid supply unit 38. Further, the rinsing liquid discharge nozzle 32 can perform a rinsing process on the substrate W by discharging the rinsing liquid supplied from the processing liquid supply unit 38.

The chemical discharge nozzle 31 and the rinsing liquid discharge nozzle 32 are integrally movable substantially in a horizontal direction. Specifically, the chemical discharge nozzle 31 and the rinsing liquid discharge nozzle 32 are respectively attached to tip parts of arms 34, 35 (FIG. 2) extending substantially in the horizontal direction via a common nozzle attaching portion 33. The arms 34, 35 are provided substantially in parallel and base end parts thereof are both connected to a rotary shaft 36 extending substantially in a vertical direction. An arm rotating mechanism 37 rotates the rotary shaft 36 about a center of rotation A1, whereby the chemical discharge nozzle 31 and the rinsing liquid discharge nozzle 32 are integrally movable between a facing position P11 facing the substrate W and a retracted position P12 above and laterally retracted from the upper surface of the substrate W as shown in FIG. 2. Then, the chemical is discharged downward from the chemical discharge nozzle 32 at the facing position P11 to perform the chemical process on the substrate surface Wf. Further, the rinsing liquid is discharged downward from the rinsing liquid discharge nozzle 32 at the facing position P11 to perform the rinsing liquid process on the substrate surface Wf. Note that the chemical discharge nozzle 31 and the rinsing liquid discharge nozzle 32 can be positioned at any arbitrary position facing the substrate W and the facing position P11 shown in FIG. 2 is an example thereof.

The DIW of a low temperature (hereinafter, referred to as "low-temperature DIW") produced by cooling the DIW of a normal temperature and supplied from a DIW supply unit 91 by a heat exchanger 92 is supplied to the low-temperature DIW discharge nozzle 41 via a pipe 411. The low-temperature DIW discharged from the low-temperature DIW discharge nozzle 41 is supplied to the substrate surface Wf to form a liquid film made of the low-temperature DIW on the substrate surface Wf.

The low-temperature DIW discharge nozzle 41 is fixedly supported by a supporting member 42 (FIG. 2) at a position above and laterally deviated from the substrate W held by the spin chuck 20, more specifically at a position above an upper surface portion 612 of a port 61 of a splash guard 60 to be described later. The low-temperature DIW discharge nozzle 41 is fixed at such a position as not to cross movement paths of the movable chemical discharge nozzle 31 and rinsing liquid discharge nozzle 32 described above, the movable cooling gas discharge nozzle 51 and high-temperature DIW discharge nozzle 52 to be described later and arms 34, 35, 53 and 54 for supporting these nozzles.

The low-temperature DIW discharge nozzle 41 includes a discharge port 41a facing toward the center of rotation A0 of the substrate W. A receiving member 43 for receiving the low-temperature DIW falling from the discharge port 41a is provided below the low-temperature DIW discharge nozzle 41. More specifically, the receiving member 43 is in the form of a dish open upward, and the low-temperature DIW dropping from the discharge port 41a is received by the receiving member 43. Then, the low-temperature DIW received by the receiving member 43 is drained to the outside of the processing chamber 10 via a pipe 431 and collected by a gas/liquid collecting unit 45.

A discharge flow rate of the low-temperature DIW from the low-temperature DIW discharge nozzle 41 is changeable. If the low-temperature DIW discharged from the discharge port 41a flows at such a relatively high flow rate as to reach the substrate surface Wf (hereinafter, referred to as a "liquid film forming flow rate"), the low-temperature DIW is supplied substantially to a center of the substrate surface Wf and a liquid film forming process is performed in which a liquid film is formed by the low-temperature DIW on the substrate surface Wf. On the other hand, if the discharge flow rate of the low-temperature DIW is lower than the liquid film forming flow rate and all the low-temperature DIW discharged from the discharge port 41a falls to the receiving member 43 without reaching the substrate surface Wf (hereinafter, referred to as a "slow leak flow rate"), a slow leak process is performed in which the low-temperature DIW is discharged from the discharge port 41a in such a manner as not to be supplied to the substrate surface Wf By performing the slow leak process before the liquid film forming process, a temperature rise due to the retention of the low-temperature DIW in the pipe 411 leading to the low-temperature DIW discharge nozzle 41 from the heat exchanger 92 and in the low-temperature DIW discharge nozzle 41 can be suppressed and the DIW of a sufficiently low temperature is supplied to the substrate surface Wf from an initial stage of the liquid film forming process. Note that a liquid temperature of the low-temperature DIW is preferably slightly higher than a freezing point of the DIW to enable the liquid film to be frozen in a short time.

The cooling gas discharge nozzle 51 discharges low-temperature nitrogen gas (hereinafter, referred to as "cooling gas") produced by cooling the nitrogen gas supplied from a nitrogen gas supply unit 57 by a heat exchanger 58. The cooling gas is cooled to have a temperature lower than the freezing point of DIW. By discharging the cooling gas toward the liquid film formed on the substrate surface Wf, a freezing process is performed in which the liquid film is frozen to form a frozen film. Further, the DIW of a high temperature (hereinafter, referred to as "high-temperature DIW") produced by heating the DIW of a normal temperature supplied from the DIW supply unit 91 by a heater 93 is supplied to the high-temperature DIW discharge nozzle 52 via a pipe 521. The high-temperature DIW discharge nozzle 52 discharges the high-temperature DIW toward the frozen film formed on the substrate surface Wf to perform a thawing process of thawing the frozen film.

The cooling gas discharge nozzle 51 and the high-temperature DIW discharge nozzle 52 are integrally movable substantially in the horizontal direction. Specifically, the cooling gas discharge nozzle 51 is attached to a tip part of an arm 53 extending substantially in the horizontal direction, and a base end part of the arm 53 is connected to a rotary shaft 55 extending substantially in the vertical direction. Further, the high-temperature DIW discharge nozzle 52 is attached to a tip part of an arm 54 extending substantially in parallel to the arm 53, and a base end part of the arm 54 is connected to the rotary shaft 55 similarly to the arm 53. An arm rotating mechanism 56 rotates the rotary shaft 55 about a center of rotation A2, whereby the cooling gas discharge nozzle 51 and the high-temperature DIW discharge nozzle 52 are integrally movable between a facing position P21 facing the substrate W and a retracted position P22 above and laterally retracted from the upper surface of the substrate W as shown in FIG. 2. Note that the cooling gas discharge nozzle 51 and the high-temperature DIW discharge nozzle 52 can be positioned at any arbitrary position facing the substrate W and the facing position P21 shown in FIG. 2 is an example thereof.

During the freezing process, the cooling gas discharge nozzle 51 discharges the cooling gas downward while moving between a position above the vicinity of the center of the substrate W and a position above the peripheral edge part of the substrate W after the liquid film is formed, whereby the liquid film is frozen. Thereafter, the high-temperature DIW discharge nozzle 52 discharges the high-temperature DIW downward in a state positioned substantially above the center of the substrate W, whereby the thawing process is performed. By supplying the high-temperature DIW to the frozen film formed by freezing the liquid film on the substrate in this way, the frozen film is thawed in a short time. Further, by integrally moving the cooling gas discharge nozzle 51 and the high-temperature DIW discharge nozzle 52, a processing time from the freezing of the liquid film to the thawing can be shortened.

A discharge flow rate of the cooling gas from the cooling gas discharge nozzle 51 is changeable. During the freezing process, the discharge flow rate is set at a relatively high flow rate (hereinafter, referred to as a "freezing flow rate") to freeze the liquid film formed on the substrate surface Wf by supplying a large quantity of the cooling gas to the liquid film. On the other hand, if the discharge flow rate of the cooling gas is set at a flow rate lower than the freezing flow rate (hereinafter, referred to as a "slow leak flow rate"), a slow leak process is performed in which the cooling gas is discharged at a low flow rate from the cooling gas discharge nozzle 51. By performing the slow leak process before the freezing process, a temperature rise caused by the retention of the cooling gas in the pipe 511 leading to the cooling gas discharge nozzle 51 from the heat exchanger 58 and in the cooling gas discharge nozzle 51 is suppressed. As a result, the cooling gas of a sufficiently low temperature can be supplied to the liquid film from an initial stage of the freezing process, whereby the liquid film can be quickly frozen.

Here, the cooling gas discharged from the cooling gas discharge nozzle 51 during the slow leak process may partly freeze the processing liquids such as the chemical and the rinsing liquid present on the substrate surface Wf. In this case, frozen fragments of the processing liquids may damage a pattern formed on the substrate surface Wf. Further, water vapor in the atmosphere may be condensed and adhere to the substrate W due to the cooling gas released into the processing space SP. Thus, the cooling gas discharged from the cooling gas discharge nozzle 51 in the slow leak process needs to be collected. To this end, a receiving member 59 for receiving the cooling gas discharged in the slow leak process is provided below the cooling gas discharge nozzle 51 positioned at the retracted position P22. The receiving member 59 is in the form of a recess open upward and the cooling gas flowing into the receiving member 59 through the opening is collected by the gas/liquid collecting unit 45 connected to the receiving member 59 via a pipe 591.

Note that the receiving member 59 is arranged at such a position as to be able to also receive the high-temperature DIW discharged from the high-temperature DIW discharge nozzle 52 positioned at the retracted position P22. Specifically, the opening in the upper part of the receiving member 59 is located at a position right below the high-temperature DIW discharge nozzle 52 positioned at the retracted position P22. By performing pre-dispensing to discharge the high-temperature DIW from the high-temperature DIW discharge nozzle 52 located at the retracted position P22 as described later, the discharged high-temperature DIW flows into the receiving member 59 and is collected into the gas/liquid collecting unit 45 via the same pipe 591 as the cooling gas is collected. The pre-dispensing is a process for discharging the high-temperature DIW of a reduced temperature retained in the pipe 521 leading to the high-temperature DIW discharge nozzle 52 from the heater 93 and in the high-temperature DIW discharge nozzle 52 in advance. The pre-dispensing is performed to quickly thaw the frozen film by supplying the DIW of a sufficiently high temperature to the frozen film from an initial stage of the thawing process.

Further, the splash guard 60 for receiving the liquid supplied to and falling from the substrate W is provided to surround the lateral periphery of the spin chuck 20 in the substrate processing apparatus 1. More specifically, the splash guard 60 includes the port 61 provided to surround the spin base 21 and configured to receive liquid droplets spun off from the substrate W, a cup 62 configured to receive the liquid flowing down along the inner side surface of the port 61 and an exhaust ring 63 configured to house the port 61 and the cup 62 inside. The spin chuck 20 is arranged in an internal space surrounding by each of these members.

A side wall 611 of the port 61 is formed into a hollow cylindrical shape substantially coaxial with the center of rotation A0 of the substrate and the upper surface portion 612 is formed into a brim protruding inward. In other words, the upper surface portion 612 extends slightly upward toward a center from an upper end part of the side wall 611, and an opening 613 having an opening diameter slightly larger than a diameter of the spin base 21 and substantially coaxial with the center of rotation A0 is provided in a central part. The port 61 is movable upward and downward by a port elevating mechanism 64, and an opening plane of the opening 613 is slightly lower than the upper surface of the spin base 21 at an lower position shown by solid line in FIG. 1, whereby the side surface of the substrate W is exposed in the processing space SP. On the other hand, at an upper position shown by dotting line in FIG. 1, the opening plane of the opening 613 is located above the upper surface of the substrate W held on the spin base 21, whereby the side surface of the substrate W is surrounded by the side wall 611 of the port 61. When various processing liquids are supplied to the substrate W, the port 61 is positioned at the upper position to receive the liquid spun off from the peripheral edge part of the substrate W. The liquid flowing down along the inner wall surface of the port 61 falls into the cup 62 provided below the side wall 611 of the port 61 and having an open upper part and is collected into a waste liquid collecting unit 65 from the cup 62.

Since the vapor of the chemical of a high concentration is filled in an internal space formed by the port 61 and the cup 62, the exhaust ring 63 is provided to exhaust this. The exhaust ring 63 is arranged to surround the port 61 and the cup 62, and an exhaust pipe 12 extending to the outside of the processing chamber 10 communicates with a lower part of the exhaust ring 63. The exhaust pipe 12 is connected to an exhaust pump 13 and the gas in the exhaust ring 63 is exhausted by the exhaust pump 13. Thus, the clean atmosphere in the processing space SP is taken in through the opening 613 in the upper part of the port 61, thereby generating an air flow flowing out to the outside via the exhaust ring 63 through a clearance between the port 61 and the cup 62. This suppresses the outflow of the vapor of the chemical, mist and the like generated in the internal space of the splash guard 60 into the processing space SP.

Figure 3:
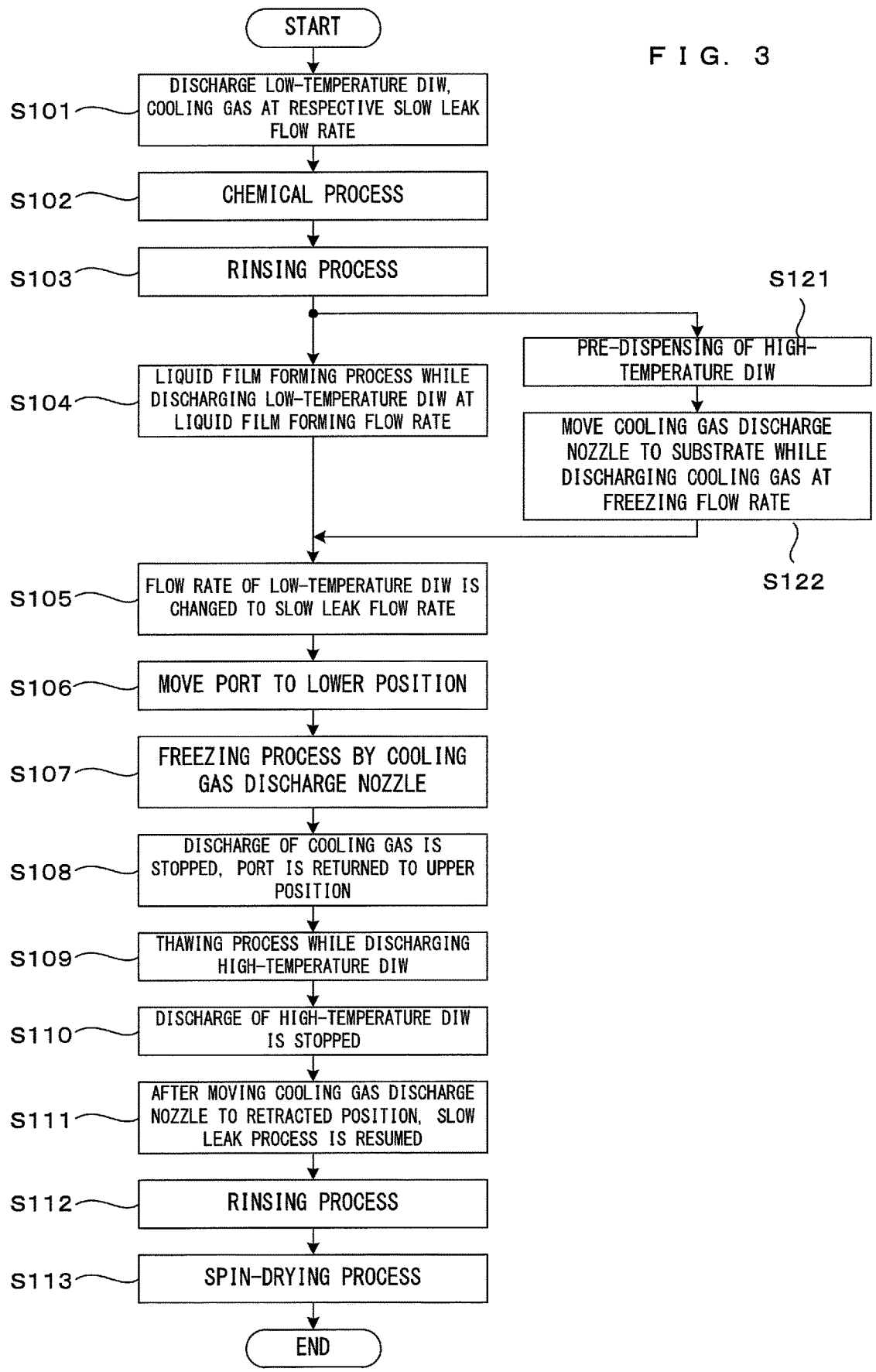
FIG. 3 is a flow chart showing an example of the substrate cleaning process.

The flow of the substrate cleaning process performed using the substrate processing apparatus 1 configured as described above is described. FIG. 3 is a flow chart showing an example of the substrate cleaning process. FIGS. 4A to 4C, 5A and 5B are views diagrammatically showing the operation of each component in the substrate cleaning process. In the substrate processing apparatus 1, an unprocessed substrate W carried into the processing chamber 10 is held by the spin chuck 20 with a surface Wf thereof faced up and the cleaning process is performed. Further, during the cleaning process, the chuck rotating mechanism 23 appropriately rotates the substrate W together with the spin base 21 at a predetermined rotation speed corresponding to each process. The port 61 of the splash guard 60 is positioned at the upper position.

Figure 4A:
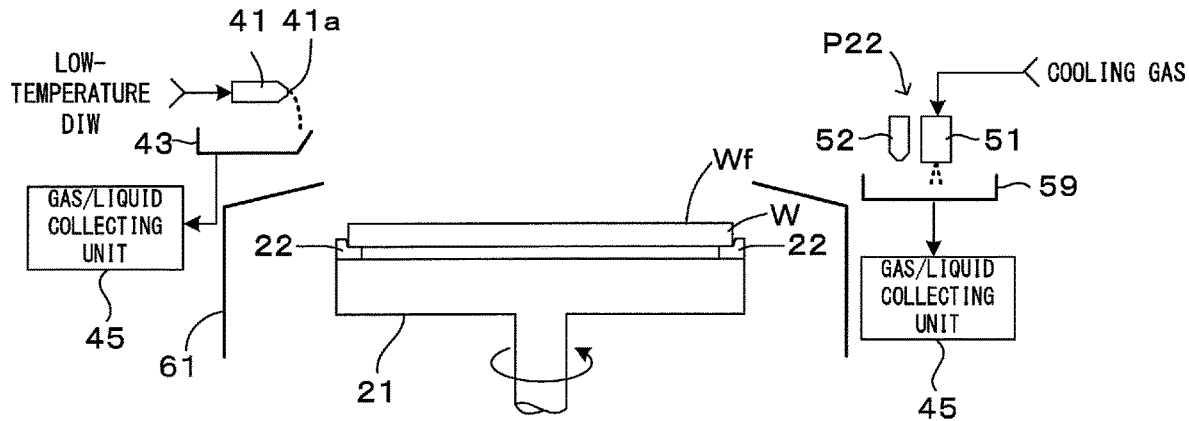
FIGS. 4A to 4C, 5A and 5B are views diagrammatically showing the operation of each component in the substrate cleaning process.

When the cleaning process is started, the low-temperature DIW slow leak process of discharging the low-temperature DIW at the slow leak flow rate (e.g. 0.1 L/min) from the discharge port 41a of the low-temperature DIW discharge nozzle 41 and the cooling gas slow leak process of discharging the cooling gas at the slow leak flow rate (e.g. 10 L/min) from the cooling gas discharge nozzle 51 at the retracted position P22 are first started (Step S101, FIG. 4A). During the execution of the low-temperature DIW slow leak process, the low-temperature DIW discharged at a relatively low flow rate from the discharge port 41a of the low-temperature DIW discharge nozzle 41 is received by the receiving member 43 without reaching the substrate W and finally collected by the gas/liquid collecting unit 45. Similarly, during the execution of the cooling gas slow leak process, the cooling gas discharged from the cooling gas discharge nozzle 51 flows into the receiving member 59 and is collected by the gas/liquid collecting unit 45.

With the low-temperature DIW and the cooling gas kept discharged at the corresponding slow leak flow rates, the chemical process and the rinsing process are subsequently performed in a state where the substrate W is rotated, for example, at 800 rpm by the chuck rotating mechanism 23 (Steps S102, S103). First, the chemical discharge nozzle 31 positioned substantially above the center of the substrate W by the arm rotating mechanism 37 discharges the chemical toward the substrate surface Wf to perform the chemical process. When the chemical process is finished, the rinsing liquid discharge nozzle 32 positioned substantially above the center of the substrate W by the arm rotating mechanism 37 discharges the rinsing liquid toward the substrate surface Wf to perform the rinsing process.

Figure 4B:
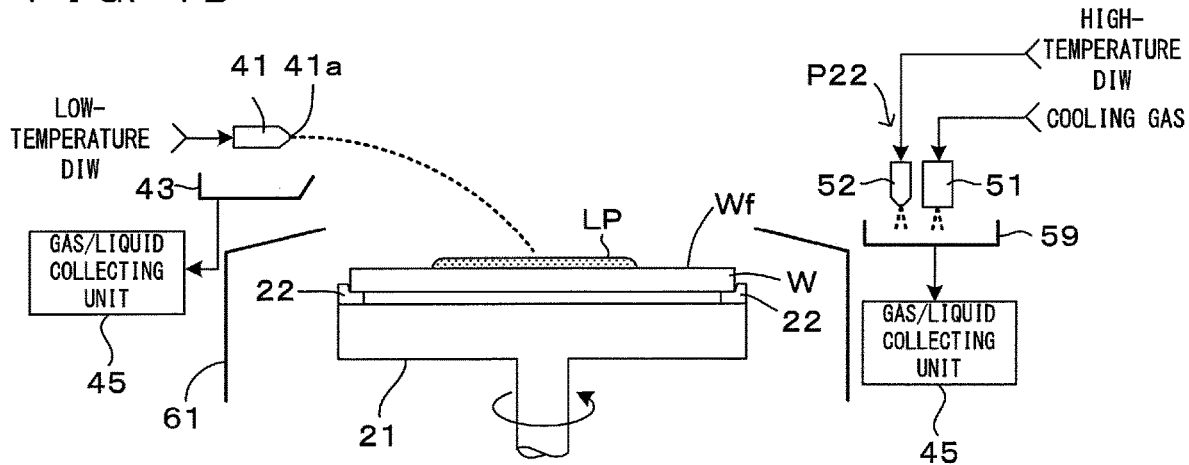
Figure 4C:
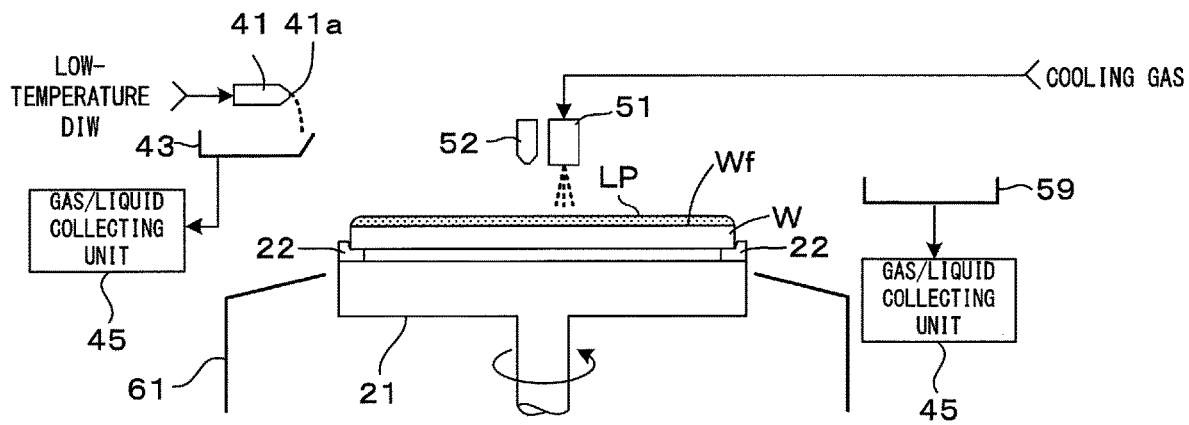
Figure 5A:
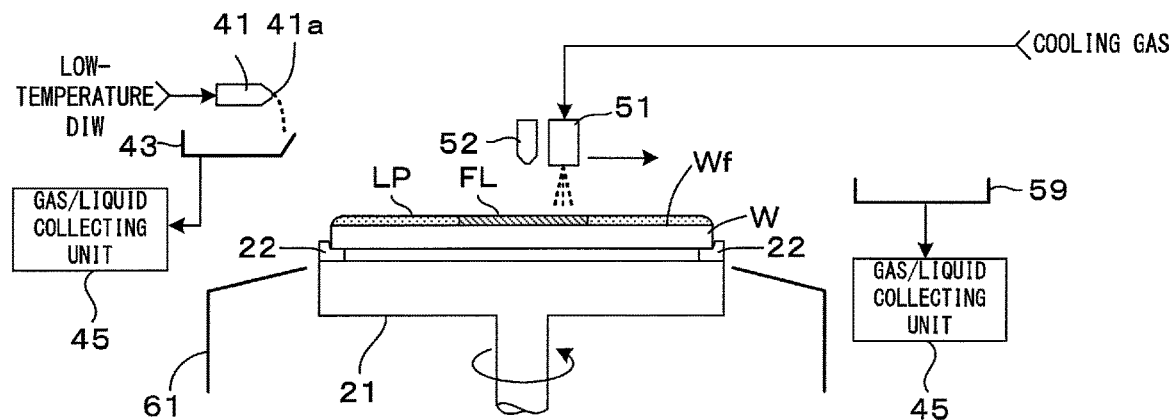
Figure 5B:
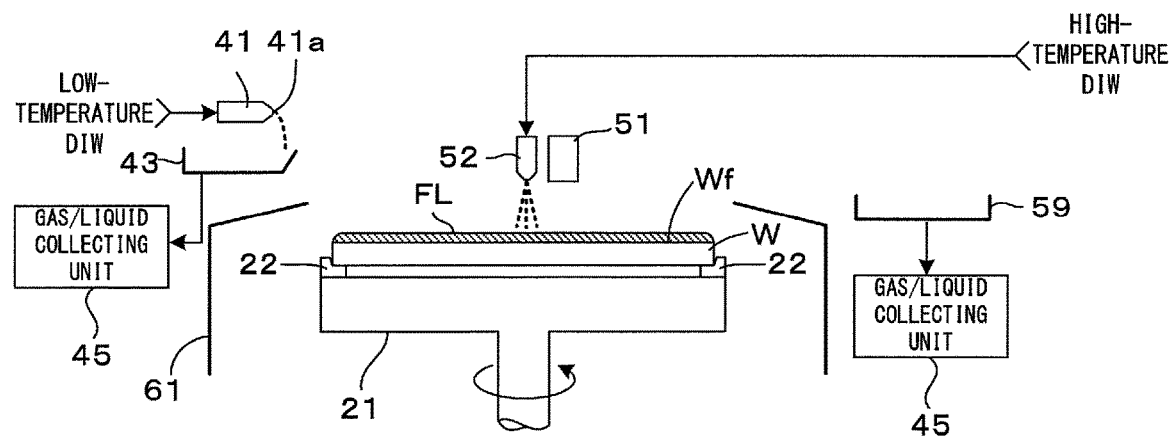

When the rinsing process is finished, the rotation speed of the substrate W is reduced, for example, to 150 rpm by the chuck rotating mechanism 23 and the discharge flow rate of the low-temperature DIW from the discharge port 41a of the low-temperature DIW discharge nozzle 41 is increased from the slow leak flow rate to the liquid film forming flow rate (e.g. 1.5 L/min) to perform the liquid film forming process (Step S104, FIG. 4B). By increasing the discharge flow rate of the low-temperature DIW to the liquid film forming flow rate, the low-temperature DIW discharged from the discharge port 41a of the low-temperature DIW discharge nozzle 41 reaches a central part of the substrate surface Wf and the low-temperature DIW supplied to the substrate surface Wf forms a liquid film LP.

Then, the low-temperature DIW supplied to the substrate surface Wf spreads from the central part to a peripheral part of the substrate W by a centrifugal force to enlarge a formation range of the liquid film LP made of the low-temperature DIW. At this time, since the rotation speed of the substrate W is reduced, it is suppressed that the low-temperature DIW supplied to the substrate surface Wf is spun off from the substrate surface Wf by an excessive centrifugal force, and the liquid film LP can be efficiently formed. When the liquid film LP is formed on the entire substrate surface Wf and the liquid film forming process is completed, the discharge flow rate of the low-temperature DIW is returned to the slow leak flow rate and the slow leak process is resumed (Step S105). By performing the low-temperature DIW slow leak process except during the execution of the liquid film forming process in this way, it is suppressed that the low-temperature DIW is retained and warmed in the pipe 411 leading to the low-temperature DIW discharge nozzle 41 and in the low-temperature DIW discharge nozzle 41. As a result, the DIW of a sufficiently low temperature whose temperature rise is suppressed is supplied from the initial stage of the liquid film forming process.

Before the liquid film forming process is finished, the pre-dispensing of discharging a predetermined amount of the high-temperature DIW by the high-temperature DIW discharge nozzle 52 at the retracted position P22 is performed (Step S121, FIG. 4B). This pre-dispensing is a process of discharging the high-temperature DIW retained in the pipe 521 leading to the high-temperature DIW discharge nozzle 52 from the heater 93 and cooled by the ambient atmosphere from the pipe 521. By performing the pre-dispensing, the DIW of a sufficiently high temperature is discharged from the high-temperature DIW discharge nozzle 52 from the beginning in the thawing process performed later. A discharge amount of the DIW during the pre-dispensing is not less than the internal volume of the pipe 521 downstream of the heater 93 and the high-temperature DIW discharge nozzle 52. Note that the high-temperature DIW discharged from the high-temperature DIW discharge nozzle 52 by the pre-dispensing is received by the receiving member 59 and finally collected by the gas/liquid collecting unit 45.

After the pre-dispensing, the arm rotating mechanism 56 moves the cooling gas discharge nozzle 51 from the retracted position P22 toward a position above the vicinity of the center of the substrate W (Step S122). By moving the cooling gas discharge nozzle 51 in parallel with the liquid film formation, the cooling gas can be immediately discharged toward the liquid film LP from the cooling gas discharge nozzle 51 after the liquid film LP is formed on the entire substrate surface Wf. This can suppress a temperature rise of the liquid film LP and shortens a processing time.

Note that the discharge flow rate of the cooling gas is increased from the slow leak flow rate to the freezing flow rate (e.g. 90 L/min) in starting the movement of the cooling gas discharge nozzle 51 in Step S122. By doing so, the cooling gas can be supplied at the freezing flow rate to the liquid film LP and the liquid film LP can be cooled also in the process of moving the cooling gas discharge nozzle 51 from the retracted position P22 toward the position above the vicinity of the center of the substrate W. Further, since the cooling gas slow leak process is performed until the cooling gas discharge nozzle 51 starts moving, the cooling gas discharged at the freezing flow rate can have a sufficient low temperature from the beginning.

When the liquid film forming process is finished, i.e. when the discharge flow rate from the low-temperature DIW discharge nozzle 41 is returned from the liquid film forming flow rate to the slow leak flow rate (Step S105), after the cooling gas discharge nozzle 51 reaches the vicinity of the center of the substrate W, the rotation speed of the substrate W is reduced, for example, to 50 rpm by the chuck rotating mechanism 23. The port 61 is moved to the lower position to expose the substrate W (Step S106, FIG. 4C). With the substrate W rotated at this rotation speed, the arm rotating mechanism 56 moves the cooling gas discharge nozzle 51 from the position above the vicinity of the center of the substrate W toward a position above the peripheral edge part of the substrate W along the upper surface of the substrate W. During that time, the cooling gas discharge nozzle 51 discharges the cooling gas at the freezing flow rate toward the liquid film LP on the substrate surface Wf. In this way, the freezing process of freezing the liquid film LP to form a frozen film FL is performed (Step S107, FIG. 5A). The liquid film LP is successively frozen from the center toward the peripheral edge part of the substrate as the cooling gas discharge nozzle 51 is moved. Finally, the frozen film FL is formed on the entire substrate surface Wf. When the cooling gas discharge nozzle 51 reaches the substrate peripheral edge part, the discharge of the cooling gas is stopped (Step S108) and the port 61 of the splash guard 60 is returned to the upper position.

Subsequently, the arm rotating mechanism 56 positions the high-temperature DIW discharge nozzle 52 at a position substantially above the center of the substrate W and the high-temperature DIW discharge nozzle 52 discharges the high-temperature DIW toward the frozen film FL on the substrate surface Wf. In this way, the thawing process of thawing the frozen film by the high-temperature DIW is performed (Step S109, FIG. 5B). Note that, in the thawing process, the thawed frozen film can be removed together with extraneous matters from the substrate surface Wf by a large centrifugal force by increasing the rotation speed of the substrate W, for example, to 2000 rpm by the chuck rotating mechanism 23. Since the pre-dispensing is performed at the retracted position P22 in advance, the high-temperature DIW discharge nozzle 52 can discharge the DIW of a high temperature from the beginning. When the thawing process is finished, the discharge of the high-temperature DIW from the high-temperature DIW discharge nozzle 52 is stopped (Step S110). After the arm rotating mechanism 56 retracts the cooling gas discharge nozzle 51 to the retracted position P22, the cooling gas slow leak process is resumed (Step S111).

Thereafter, the arm rotating mechanism 37 moves the rinsing liquid discharge nozzle 32 from the retracted position P12 to the facing position P11. Then, the rinsing liquid discharge nozzle 32 positioned substantially above the center of the substrate W discharges the rinsing liquid toward the substrate surface Wf to perform the rinsing process (Step S112). Finally, after the supply of the rinsing liquid to the substrate W is stopped and the rinsing liquid discharge nozzle 32 is retracted to the retracted position P12, the chuck rotating mechanism 23 increases the rotation speed of the substrate W, for example, to 2500 rpm to perform a spin-drying process (Step S113), whereby a series of cleaning processes are finished.

Here, a low-temperature DIW supply unit for supplying the low-temperature DIW to the low-temperature DIW discharge nozzle 41 is described in detail. FIG. 6 is a block diagram showing the configuration of the low-temperature DIW supply unit. The low-temperature DIW supply unit 90 includes a pipe 911 connecting the DIW supply unit 91 and the heat exchanger 92, a flow rate adjusting valve 95 disposed in the pipe 911 and a valve control unit 96 for controlling the flow rate adjusting valve 95 in addition to the DIW supply unit 91 and the heat exchanger 92 described above. The flow rate of the low-temperature DIW discharged from the low-temperature DIW discharge nozzle 41 can be adjusted by the valve control unit 96 controlling the flow rate of the DIW passing through the flow rate adjusting valve 95.

As just described, in this embodiment, the flow rate of the low-temperature DIW discharged from the discharge port 41a of the low-temperature DIW discharge nozzle 41 can be switched to the slow leak flow rate and the liquid film forming flow rate by the valve control unit 96 controlling the flow rate adjusting valve 95. By setting the discharge flow rate of the low-temperature DIW to the slow leak flow rate and the performing the slow leak process of discharging the low-temperature DIW from the discharge port 41a without supplying the low-temperature DIW to the substrate surface Wf before the liquid film forming process is performed, the low-temperature DIW can be flowed in the pipe 411 and the low-temperature DIW discharge nozzle 41 before the liquid film LP is formed. As a result, it is suppressed that the low-temperature DIW is retained and warmed in the pipe 411 and the low-temperature DIW discharge nozzle 41. In discharging the low-temperature DIW to the substrate surface Wf to form the liquid film LP, the DIW of a low temperature whose temperature rise is suppressed is discharged from the initial stage. Thus, the liquid film LP of a sufficiently low temperature can be formed on the substrate surface Wf and throughput can be improved by shortening a time required to freeze the liquid film LP.

Further, in this embodiment, extraneous matters such as particles adhering to the substrate W are removed by forming the liquid film on the surface Wf of the substrate W as an object to be cleaned, freezing the liquid film and thawing and removing the frozen film. In this embodiment, to improve the throughput of the process, the following configurations are adopted.

(1) The liquid film is formed by supplying the low-temperature DIW to the substrate W.

(2) The cooling gas discharge nozzle 51 is arranged at the position facing the substrate W when the supply of the low-temperature DIW is finished.

(3) The frozen film is quickly thawed by supplying the high-temperature DIW to the frozen film.

(4) The fluid of a desired temperature is discharged from the initial stage of the discharge by discharging each fluid of the low-temperature DIW, the cooling gas and the high-temperature DIW from the nozzle prior to the supply to the substrate W.

Out of these, the configuration (3) contributes not only to improving the throughput of the cleaning process, but also to obtaining a good cleaning result as described below.

Figure 7:
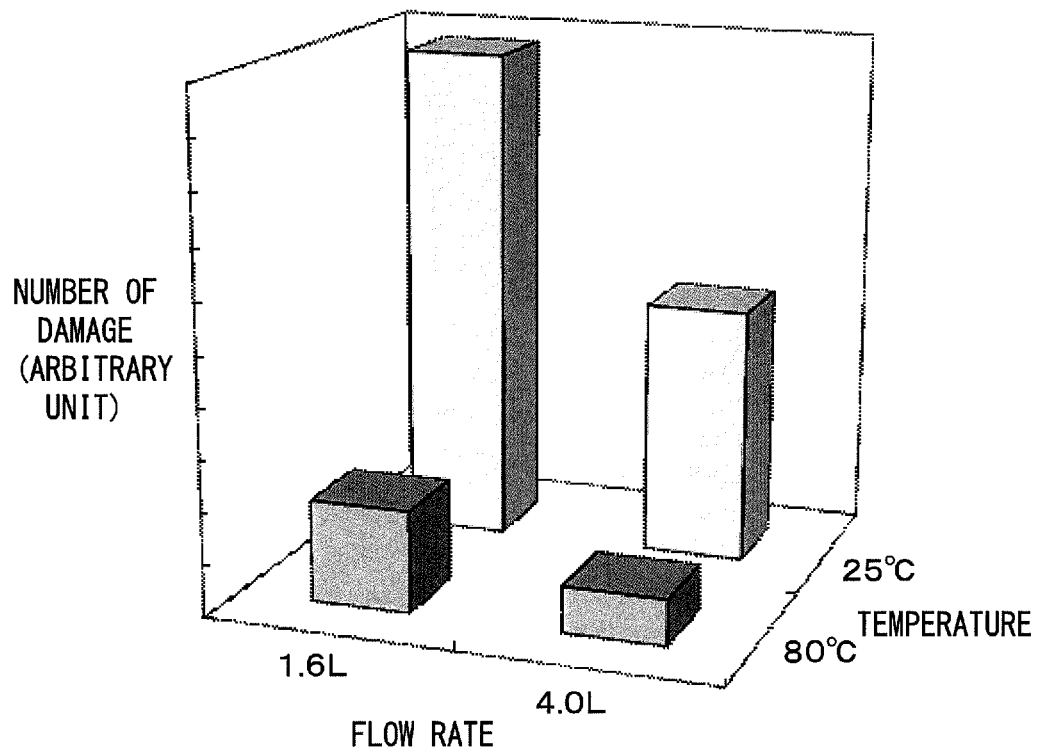
FIG. 7 is a graph showing a relationship of the temperature and flow rate of the thawing liquid and damages remaining on the substrate after cleaning.

FIG. 7 is a graph showing a relationship of the temperature and flow rate of the thawing liquid and damages remaining on the substrate after cleaning, more specifically a graph showing an example of a result of measuring the number of damages remaining on the substrate W after cleaning when the liquid temperature and flow rate of the DIW as the thawing liquid to be supplied to the frozen film were changed after the liquid film formed on the substrate W was frozen. As is clear from the graph, there were fewer damages at the same flow rate when the liquid temperature was 80° C. than when it was 25° C. and there are fewer damages at the same liquid temperature when the flow rate was high than it was low.

According to the knowledge of the inventors of this application, such damages are thought to be caused by the rubbing of fragments of the partly thawed frozen film on the substrate W against the substrate surface Wf when flowing along the substrate W together with the thawing liquid. Specifically, a heat amount sufficient to thaw the entire frozen film on the substrate W cannot be given to the frozen film by the thawing liquid if the temperature of the thawing liquid supplied to the substrate W is low or the flow rate thereof is low. The fragments of the partly remaining frozen film damage the substrate surface Wf by moving while rubbing the substrate surface Wf. Contrary to this, the frozen film is thawed at once if the liquid temperature of the thawing liquid is high or the flow rate thereof is sufficiently high, wherefore the damages of the substrate W caused by the fragments of the frozen film are suppressed. Thus, in this embodiment, the high-temperature DIW of about 80° C. is used as the thawing liquid for removing the frozen film formed by freezing the liquid film on the substrate W.

The high-temperature DIW is produced by heating the DIW of a normal temperature supplied from the DIW supply unit 91 by the heater 93. The high-temperature DIW fed from the heater 93 is discharged toward the substrate W from the high-temperature DIW discharge nozzle 52 by way of the pipe 521 in the thawing process. Before the discharge to the substrate W is started, the retained thawing liquid of a reduced temperature remains in the pipe 521 and the high-temperature DIW discharge nozzle 52. If such a thawing liquid of a reduced temperature is supplied to the frozen film on the substrate W in the initial stage of the thawing process, the substrate may be damaged due to insufficient thawing of the frozen film as described above.

To solve this problem, in this embodiment, the pre-dispensing of discharging a predetermined amount of the thawing liquid by the high-temperature DIW discharge nozzle 52 at the retracted position P22 is performed (Step S121 of FIG. 3) before the high-temperature DIW discharge nozzle 52 discharges the thawing liquid at the position facing the substrate W to perform the thawing process. By doing so, the thawing liquid of a reduced temperature retained in the flow path leading to the high-temperature DIW discharge nozzle 52 from the pipe 521 is discharged in advance and the liquid in the flow path is replaced by the high-temperature DIW newly fed from the heater 93. Thus, when the high-temperature DIW discharge nozzle 52 is located above the center of the substrate W and performs the thawing process, the high-temperature DIW having a sufficient heat amount can be supplied to the frozen film on the substrate W from the initial stage of the thawing process. This causes the frozen film on the substrate W to be thawed at once and prevents the substrate W from being damaged by fragments of the frozen film remaining without being thawed.

The amount (volume) of the thawing liquid discharged during the pre-dispensing is not less than the internal volume of the flow path for the thawing liquid from the heater 93 to the high-temperature DIW discharge nozzle 52. This causes all the thawing liquid of a reduced temperature remaining in the flow path to be discharged and replaced by the high-temperature DIW newly fed from the heater 93.

By performing the slow leak process of constantly discharging the low-temperature DIW or the cooling gas at a low flow rate in the low-temperature DIW discharge nozzle 41 or the cooling gas discharge nozzle 51, a temperature rise of the fluid discharged from these nozzles can be suppressed. On the other hand, the discharge of the thawing liquid from the high-temperature DIW discharge nozzle 52 needs to be stopped while the cooling gas discharge nozzle 51 freezes the liquid film on the substrate W by discharging the cooling gas. This is because the frozen film may be partly thawed to cause damages or impair effects of the freeze cleaning, for example, if the high-temperature DIW is discharged except during the execution of the thawing process such as when the high-temperature DIW discharge nozzle 52 moves from the retracted position P22 to the position right above the center of rotation A0 of the substrate W. There is also a possibility of increasing the temperatures of the substrate W and the surrounding members and extending a time required for the process.

In view of these problems, in the pre-dispensing of this embodiment, the thawing liquid remaining in the pipe 521 and the high-temperature DIW discharge nozzle 52 is discharged immediately before the cooling gas discharge nozzle 51 for performing the freezing process and the high-temperature DIW discharge nozzle 52 move from the retracted position P22 to the position facing the substrate W. The time required for the freezing process, i.e. the time to scan the cooling gas discharge nozzle 51 across the substrate W is about several seconds. Even if a time until the high-temperature DIW discharge nozzle is positioned above the center of rotation A0 of the substrate W and starts discharging the thawing liquid thereafter is included, a temperature reduction of the thawing liquid during this period is small. By arranging the cooling gas discharge nozzle 51 and the high-temperature DIW discharge nozzle 52 proximate to each other and integrally moving them, a transition time from the freezing process to the thawing process can also be shortened. Further, if the pre-dispensing is performed during the execution of the liquid film forming process before the execution of the freezing process, a transition time from the liquid film forming process to the freezing process can also be shortened.

FIG. 8 is a graph showing a temperature change of the thawing liquid discharged from the high-temperature DIW discharge nozzle, more specifically a graph showing an example of a result of measuring the temperature of the thawing liquid immediately after being discharged from the high-temperature DIW discharge nozzle 52 when the pre-dispensing was performed and when the pre-dispensing was not performed. Note that the temperature of the ambient atmosphere is detected before the discharge of the thawing liquid. When the pre-dispensing is performed, the thawing liquid of a high temperature of about 70° C. to 80° C. is discharged from the high-temperature DIW discharge nozzle 52 immediately after the start of the discharge. Thereafter, the temperature of the thawing liquid decreases with time. This is thought to be because the DIW remained in the heater 93 for a short time and having received no sufficient heat amount is discharged.

Note that it is during a short period (e.g. several seconds) immediately after the start of the discharge of the thawing liquid that the insufficient heat amount of the thawing liquid causes problems such as damages on the substrate W, and it is sufficient to discharge the thawing liquid of a high temperature having a sufficient heat amount during this period. Thus, the liquid temperature immediately after the start of the discharge is most important and a temperature reduction after the passage of time following the start of the discharge is not problematic.

On the other hand, when the high-temperature DIW discharge nozzle 52 discharges the thawing liquid without performing the pre-dispensing, the thawing liquid of a temperature reduced to the vicinity of the normal temperature is discharged immediately before the start of the discharge. Thereafter, the liquid temperature gradually increases, but only to a maximum temperature of about 60° C. As just described, by performing the pre-dispensing, damages on the substrate W can be effectively suppressed by supplying the thawing liquid of a high temperature to the frozen film on the substrate W immediately after the start of the discharge and quickly thawing the frozen film in a short time.

As shown in FIGS. 2 and 4B, the thawing liquid discharged for the pre-dispensing from the high-temperature DIW discharge nozzle 52 at the retracted position P22 flows into the receiving member 59 provided below this nozzle. This receiving member 59 also functions to collect the cooling gas discharged for the slow leak process from the cooling gas discharge nozzle 51 into the gas/liquid collecting unit 45. Why such a configuration for collecting the cooling gas discharged for the slow leak process from the cooling gas discharge nozzle 51 and the thawing liquid discharged for the pre-dispensing from the high-temperature DIW discharge nozzle 52 are collected in the same collection path is adopted is described.

Besides the cooling gas discharged from the cooling gas discharge nozzle 51 for the slow leak process, the high-humidity atmosphere in the processing space SP also flows into the collection path leading to the gas/liquid collecting unit 45 from the receiving member 59 via the pipe 591. Such a high-humidity atmosphere may be cooled by the cooling gas to cause dew condensation and frost in the collection path and clog the collection path. Against such a problem, the thawing liquid as a liquid of a relative high temperature flows into the collection path in this embodiment. This solves the deposition of frost and prevents the clogging of the collection path.

By utilizing the thawing liquid discharged from the high-temperature DIW discharge nozzle 52 for the pre-dispensing for this purpose, the thawing liquid merely to be wasted is effectively reutilized. Further, it is not necessary to separately provide equipment for removing frost from the collection path and consume the processing liquids and the like. If the discharge amount of the thawing liquid during the pre-dispensing is set at such an amount that part of the high-temperature DIW newly fed from the heater 93 reaches the receiving member 59, the frost can be more reliably removed by the flow of the thawing liquid of a high temperature into the receiving member 59. The cooling gas (nitrogen gas) and the thawing liquid (DIW) collected into the gas/liquid collecting unit 45 are separated into a gas component and a liquid component by an unillustrated known gas/liquid separator and respectively wasted or reused.

As just described, in this embodiment, the cooling gas of a low temperature discharged from the cooling gas discharge nozzle 51 for performing the slow leak process at the retracted position and the high-temperature DIW as the thawing liquid discharged from the high-temperature DIW discharge nozzle 52 for performing the pre-dispensing at the retracted position are received by the common receiving member 59. Then, these are drained to the outside of the processing chamber 10 via the common pipe 591 and collected by the gas/liquid collecting unit 45.

The slow leak process is performed at the retracted position before the cooling gas discharge nozzle 51 is caused to face the substrate W and supplies the cooling gas to the liquid film on the substrate W. This can suppress a temperature rise in the flow path for the cooling gas and freeze the liquid film in a short time by supplying the cooling gas of a sufficiently low temperature to the liquid film from the initial stage of the freezing process. Particularly, by performing the slow leak process while the low-temperature DIW is supplied to the substrate W to form the liquid film, the cooling gas of a low temperature can be supplied to the substrate W immediately after the formation of the liquid film.

Further, the pre-dispensing is performed before the high-temperature DIW discharge nozzle 52 is moved from the retracted position to the position facing the substrate W. This causes the thawing liquid of a reduced temperature retained in the flow path to be discharged in advance and enables the frozen film to be thawed and removed in a short time by supplying the thawing liquid of a sufficiently high temperature to the frozen film from the initial stage of the thawing process. By thawing the frozen film at once in a short time, damages on the substrate W by fragments of the frozen film are also prevented.

The cooling gas and the thawing liquid discharged and collected without being supplied to the substrate W flow into the common collection path (receiving member 59 and pipe 591). Thus, the clogging of the collection path by the frost caused in the pipe 591 by the inflow of the cooling gas can be prevented.

More specifically, the retracted position of the cooling gas discharge nozzle 51 and that of the high-temperature DIW discharge nozzle 52 are proximate and the receiving member 59 covering both positions right below the cooling gas discharge nozzle 51 and the high-temperature DIW discharge nozzle 52 positioned at the respective retracted positions is provided. Both the cooling gas discharged from the cooling gas discharge nozzle 51 and the thawing liquid discharged from the high-temperature DIW discharge nozzle 52 flow into the receiving member 59 and is drained to the outside of the processing chamber 10 via the pipe 591.

Further, this embodiment is configured such that the cooling gas discharge nozzle 51 and the high-temperature DIW discharge nozzle 52 are respectively supported by the arms 53, 54 extending substantially in the horizontal direction from the rotary shaft 55 and are moved relative to the substrate W by being integrally rotated with the rotation of the rotary shaft 55 while maintaining a distance therebetween. Since the supply of the fluid to the substrate W from these two nozzles is performed at different timings, it is possible to integrally move the both in this way. By adopting such a configuration, it is possible to simplify the members and the rotating mechanisms arranged around the substrate W.

In such a configuration, after the pre-dispensing is performed by the high-temperature DIW discharge nozzle 52 at the retracted position, the cooling gas discharge nozzle 51 and the high-temperature DIW discharge nozzle 52 may be integrally moved to the positions facing the substrate W to successively perform the freezing process and the thawing process. By doing so, the freezing process and the thawing process can be performed one after the other and the throughput of the process can be improved. Further, by performing the thawing process before the temperature of the frozen film increases after the liquid film is frozen, a particle removal rate can also be improved.

Further, in this embodiment, the slow leak flow rate of the low-temperature DIW is lower than the liquid film forming flow rate. Thus, a consumption amount of the low-temperature DIW discharged from the low-temperature DIW discharge nozzle 41 during the slow leak process and not contributing to the formation of the liquid film LP can be reduced.

Further, in this embodiment, a continuous transition is made from the slow leak process to the liquid film forming process by increasing the flow rate of the low-temperature DIW discharged from the discharge port 41a from the slow leak flow rate to the liquid film forming flow rate while the discharge of the low-temperature DIW from the discharge port 41a is maintained. If a continuous transition is made from the slow leak process to the liquid film forming process while the discharge of the low-temperature DIW from the discharge port 41a is maintained in this way, it is possible to reliably maintain a flowing state of the low-temperature DIW in the pipe 411 and the low-temperature DIW discharge nozzle 41 and suppress a temperature rise of the low-temperature DIW also during the transition. Further, the liquid film can be quickly formed by increasing the flow rate of the low-temperature DIW to the liquid film forming flow rate in the liquid film forming process.

Further, in this embodiment, the low-temperature DIW discharge nozzle 41 is fixedly supported at the position above and laterally deviated from the substrate W held by the spin chuck 20. Accordingly, even if each of the other nozzles 31, 32, 51 and 52 is movable as in this embodiment, it is possible to prevent the mutual interference of the nozzles while avoiding the complication of the configuration of each nozzle and a movement control by fixing the low-temperature DIW discharge nozzle 41 at a proper position. Further, the low-temperature DIW discharge nozzle 41 is arranged at the position above and laterally deviated from the substrate W. Thus, a discharged state of the low-temperature DIW can be switched between a state where the low-temperature DIW does not reach the substrate W (state in the slow leak process) and a state where the low-temperature DIW reaches the substrate W (state in the liquid film forming process) only by changing the discharge flow rate of the low-temperature DIW.

Further, in this embodiment, the arm rotating mechanism 56 rotates the rotary shaft 55 of the arm 54 so that the cooling gas discharge nozzle 51 is located at the facing position P21 facing the substrate W when the discharge of the low-temperature DIW at the liquid film forming flow rate from the discharge port 41a is finished, i.e. when the liquid film forming process is finished. Accordingly, the cooling gas can be discharged to the liquid film LP immediately after the liquid film LP is formed on the entire substrate surface Wf, and a time until the start of the freezing of the liquid film LP can be shortened. Note that, in this embodiment, the low-temperature DIW discharge nozzle 41 is fixed at the position above and laterally deviated from the substrate W held by the spin chuck 20 and discharges the low-temperature DIW toward the substrate surface Wf at this position, thereby forming the liquid film LP. Thus, even during the liquid film forming process, the cooling gas discharge nozzle 51 is easily moved to the facing position P21 until the liquid film forming process is finished while avoiding interference with the low-temperature DIW discharge nozzle 41.

Furthermore, in this embodiment, the cooling gas discharge nozzle 51 discharges the cooling gas also while moving from the retracted position P22 to the position above the vicinity of the center of the substrate W. By doing so, the liquid film LP on the substrate surface Wf can be cooled also during the movement of the cooling gas discharge nozzle 51.

Further, in this embodiment, the low-temperature DIW discharge nozzle 41 is located at the position above and laterally deviated from the substrate W while the cooling gas discharge nozzle 51 discharges the cooling gas toward the liquid film LP on the substrate surface Wf. Accordingly, a considerable distance can be ensured between the cooling gas supplied to the liquid film LP and the low-temperature DIW discharge nozzle 41 while the cooling gas discharge nozzle 51 discharges the cooling gas toward the liquid film LP on the substrate surface Wf. The occurrence of a problem of cooling the low-temperature DIW discharge nozzle 41 by the cooling gas and freezing the low-temperature DIW in the low-temperature DIW discharge nozzle 41 can be suppressed. Particularly, in this embodiment, the low-temperature DIW discharge nozzle 41 is fixed at the position above and laterally deviated from the substrate W held by the spin chuck 20 as described above. Thus, the low-temperature DIW discharge nozzle 41 is inevitably maintained at the position above and laterally deviated from the substrate W also while the cooling gas discharge nozzle 51 discharges the cooling gas toward the liquid film LP.

Further, in this embodiment, the port 61 is provided which surrounds around the substrate W held by the spin chuck 20 to house the substrate W in the internal space and is formed with the opening 613 communicating with the internal space and located above the substrate W. The low-temperature DIW discharge nozzle 41 is fixed at the position above and laterally deviated from the opening 613. By fixing the low-temperature DIW discharge nozzle 41 at the position above and laterally deviated from the opening 613 in this way, it can be suppressed that the low-temperature DIW discharged from the discharge port 41a in the slow leak process passes through the opening 613 and falls onto the substrate surface Wf housed in the port 61. Note that, specific arrangement and configuration for achieving such an effect are not limited to the arrangement of the low-temperature DIW discharge nozzle 41 at the position right above the upper surface portion 612 of the port 61 as in this embodiment, and the low-temperature DIW discharge nozzle 41 may be arranged at an outer side of the side wall 611 of the port 61.

Further, in this embodiment, the receiving member 43 for receiving the low-temperature DIW discharged from the discharge port 41 in the low-temperature DIW slow leak process is provided below the low-temperature DIW discharge nozzle 41. The low-temperature DIW received by the receiving member 43 is collected by the gas/liquid collecting unit 45 via the pipe 431. Thus, the low-temperature DIW discharged from the discharge port 41a in the slow leak process can be drained without falling onto the substrate surface Wf.

Further, in this embodiment, the chemical process and the rinsing process are performed before the liquid film forming process and the low-temperature DIW slow leak process is performed in parallel during the execution of these processes. Thus, the liquid film forming process can be performed using the DIW of a sufficiently low temperature immediately after the chemical process and the rinsing process and the throughput of the substrate process can be improved.

As described above, in this embodiment, the spin chuck 20 functions as a "substrate holder" of the invention, the low-temperature DIW discharge nozzle 41, the cooling gas discharge nozzle 51 and the high-temperature DIW discharge nozzle 52 respectively function as a "liquid film former", a "cooling gas discharge nozzle" and a "thawing liquid discharge nozzle". Further, the DIW supply unit 91 and the heater 93 integrally function as a "thawing liquid supplier" of the invention and the pipe 521 functions as a "pipe" of the invention.

Further, in this embodiment, the receiving member 59 functions as a "fluid receiver" of the invention, whereas the pipe 591 leading to the gas/liquid collecting unit 45 from the receiving member 59 corresponds to a "flow passage" of the invention. All of these function as a "receiver" of the invention. Further, in this embodiment, the arms 53, 54, the rotary shaft 55 and the arm rotating mechanism 56 integrally function as a "nozzle holder" of the invention.

Further, in this embodiment, the low-temperature DIW functions as a "cold liquid" and the low-temperature DIW supply unit 90 functions as a "cold liquid supplier" of the invention. Further, the low-temperature DIW discharge nozzle 41 also functions as a "cold liquid discharge nozzle" of the invention. The discharged state of the low-temperature DIW in the slow leak process corresponds to a "preliminary discharged state", and the discharged state of the low-temperature DIW in the liquid film forming process corresponds to a "liquid film forming state" of the invention. Further, the flow rate adjusting valve 95 and the valve control unit 96 integrally function as a "switcher" of the invention. Further, the high-temperature DIW discharge nozzle 52 functions as a "remover" of the invention, the arm rotating mechanism 56 functions as a "driver" of the invention and the port 61 functions as a "liquid scattering preventing member" of the invention. Further, the pipe 431 and the gas/liquid collecting unit 45 function as a "drainer" of the invention.

Further, the step of performing the slow leak process corresponds to a "preliminary discharging step" of the invention, and the step of performing the liquid film forming process corresponds to a "liquid film forming step" of the invention. Further, the step of performing the freezing process and the step of performing the thawing process respectively correspond to a "freezing step" and a "removing step" of the invention. Further, the step of performing the chemical process and the rinsing process correspond to a "wet processing step" of the invention.

Note that the invention is not limited to the above embodiment and elements of the above embodiment can be appropriately combined or various changes can be made without departing from the gist thereof. Although the configuration common to the above embodiment is not described below, similar effects are achieved by having the configuration common to the above embodiment.

For example, although the cooling gas discharge nozzle 51 and the high-temperature DIW discharge nozzle 52 integrally move in the above embodiment, there is no limitation to such a configuration. For example, the invention can be applied also to an apparatus configured as described below. In the following description, the same components as in the above embodiment are denoted by the same reference signs and not described in detail.

Figure 9A:
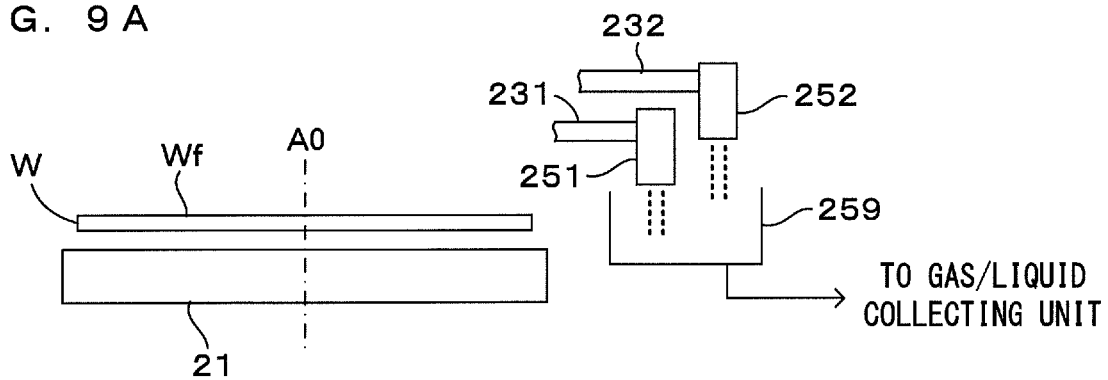
FIGS. 9A to 9C are diagrams showing a main configuration of a first modification of the substrate processing apparatus according to this invention.
Figure 9B:
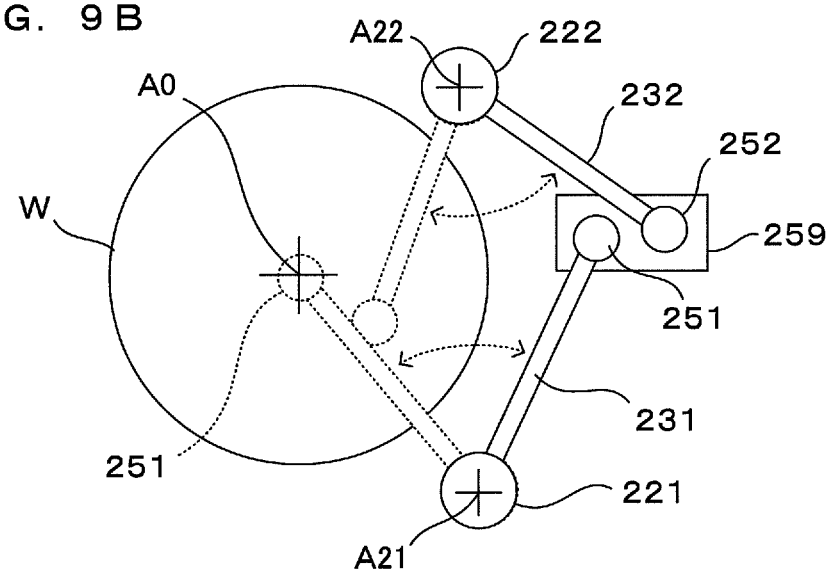
Figure 9C:
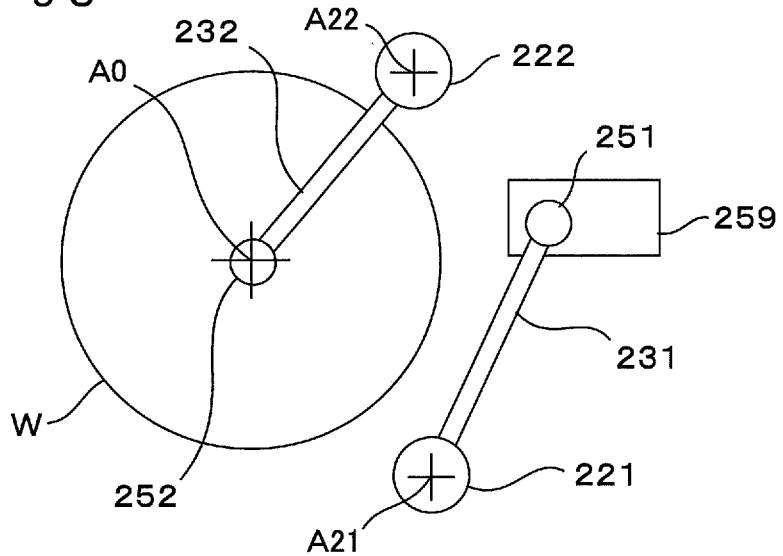

FIGS. 9A to 9C are diagrams showing a main configuration of a first modification of the substrate processing apparatus according to this invention. More specifically, FIG. 9A is a side view showing the main configuration of this modification, and FIGS. 9B and 9C are top views. In this modification, a cooling gas discharge nozzle 251 for discharging cooling gas and a high-temperature DIW discharge nozzle 252 for discharging high-temperature DIW as a thawing liquid are independently scanned and moved relative to a substrate W. Specifically, the cooling gas discharge nozzle 251 is attached to the tip of an arm 231 horizontally extending from a rotary shaft 221 rotatable about a center of rotation A21, and horizontally moved while facing the upper surface of the substrate W by a pivotal movement of the arm 231 with the rotation of the rotary shaft 221. On the other hand, the high-temperature DIW discharge nozzle 252 is attached to the tip of an arm 232 horizontally extending from a rotary shaft 222 rotatable about a center of rotation A22, and horizontally moved while facing the upper surface of the substrate W by a pivotal movement of the arm 232 with the rotation of the rotary shaft 222. The cooling gas discharge nozzle 251 and the high-temperature DIW discharge nozzle 252 are movable to positions right above a center of rotation A0 of the substrate W.

Rotational ranges of the cooling gas discharge nozzle 251 and the high-temperature DIW discharge nozzle 252 are so set that the cooling gas discharge nozzle 251 and the high-temperature DIW discharge nozzle 252 are proximate to each other when being positioned at retracted positions above and laterally deviated from the substrate W. A receiving member 259 is provided below the cooling gas discharge nozzle 251 and the high-temperature DIW discharge nozzle 252 at the retracted positions. The cooling gas and the thawing liquid respectively discharged by the cooling gas discharge nozzle 251 and the high-temperature DIW discharge nozzle 252 at the retracted positions are received by the receiving member 259 and discharged to a gas/liquid collecting unit.

Each component operates as follows in the substrate cleaning process in this case. Basic operations of the substrate cleaning process are the same as in the above embodiment, but moving modes of the nozzles in the freezing process and the thawing process are different. Specifically, in the freezing process, the cooling gas discharge nozzle 251 is moved to a position facing the substrate W as illustrated by dotted line in FIG. 9B and scanned and moved relative to the substrate W while discharging the cooling gas. After being scanned and moved to a peripheral edge part of the substrate W, the cooling gas discharge nozzle 251 is returned to the retracted position shown by solid line. The slow leak process by the cooling gas discharge nozzle 251 is performed before the freezing process also in this modification.

On the other hand, the high-temperature DIW discharge nozzle 252 is positioned at the retracted position shown by solid line in FIG. 9B while the freezing process is performed. After performing the pre-dispensing of discharging a predetermined amount of the thawing liquid immediately before the freezing process is finished, the high-temperature DIW discharge nozzle 252 is moved to a position right above the center of rotation A0 of the substrate W shown in FIG. 9C and supplies the high-temperature DIW as the thawing liquid to a frozen film on the substrate W. After the supply of the thawing liquid is continued for a predetermined time, the high-temperature DIW discharge nozzle 252 is returned to the retracted position.

As just described, in this modification, the cooling gas discharge nozzle 251 and the high-temperature DIW discharge nozzle 252 are respectively attached to the independent pivot arms. These nozzles are arranged proximate to each other at the retracted positions and the receiving member 259 is provided below the nozzles at that time. Both the cooling gas discharged from the cooling gas discharge nozzle 251 for the slow leak process and the thawing liquid discharged from the high-temperature DIW discharge nozzle 252 for the pre-dispensing flow into the receiving member 259 are collected into the gas/liquid collecting unit via a common pipe. Note that at least one arm may be configured to be movable upward and downward to make the cooling gas discharge nozzle 251 (and arm 231) and the high-temperature DIW discharge nozzle 252 (and arm 232) movable between the retracted position and the facing position facing the substrate W without interfering with each other.

Figure 10A:
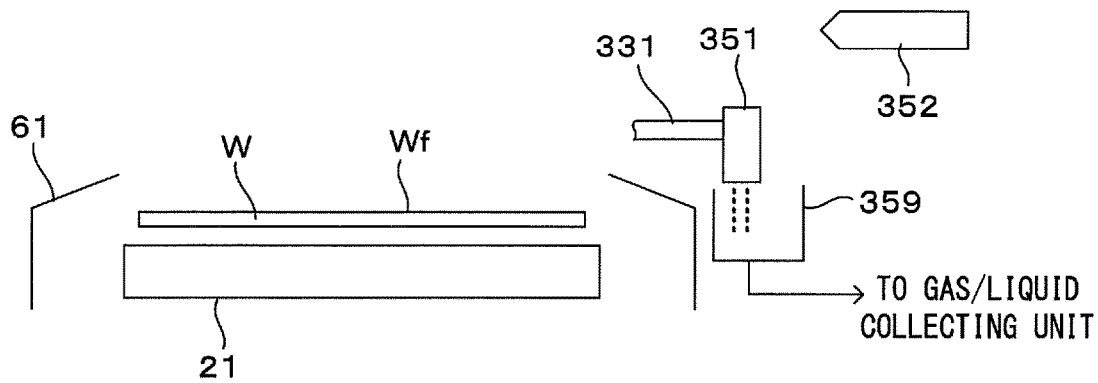
FIGS. 10A to 10C are diagrams showing a main configuration of a second modification of the substrate processing apparatus according to this invention.
Figure 10B:
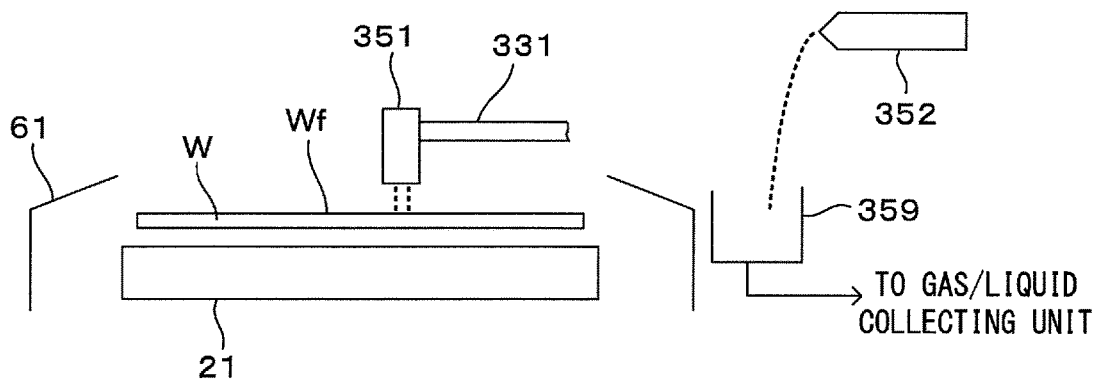
Figure 10C:
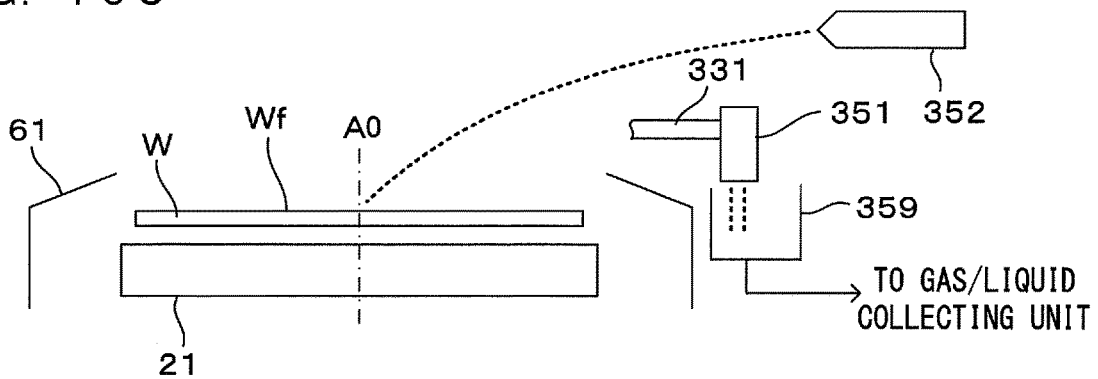

FIGS. 10A to 10C are diagrams showing a main configuration of a second modification of the substrate processing apparatus according to this invention. The structures of a cooling gas discharge nozzle 351 and an arm 331 for supporting this in this modification are the same as those of the cooling gas discharge nozzle 251 and the arm 231 in the first modification. Further, the structure and function of a receiving member 359 are also the same as those of the receiving member 259 of the first modification.

On the other hand, a high-temperature DIW discharge nozzle 352 in this modification is fixed at a position above and deviated from a port 61 of a splash guard 60 similarly to the low-temperature DIW discharge nozzle 41 (FIG. 1) for forming a liquid film on a substrate W as shown in FIG. 10A. As shown in FIG. 10B, the thawing liquid is discharged at a relatively low flow rate from the high-temperature DIW discharge nozzle 352 to perform the pre-dispensing while the cooling gas discharge nozzle 351 supplies the cooling gas to a liquid film on a substrate W at a position facing the substrate W. The arrangement of the high-temperature DIW discharge nozzle 352 and the receiving member 359 and a discharge amount from the high-temperature DIW discharge nozzle 352 are so set that the thawing liquid flowing down from the high-temperature DIW discharge nozzle 352 flows into the receiving member 359 at this time.

When the supply of the cooling gas to the substrate W is finished, the cooling gas discharge nozzle 351 is returned to the retracted position right above the receiving member 359 and the thawing liquid (high-temperature DIW) is supplied at a relatively high flow rate toward the center of rotation A0 of the substrate W from the high-temperature DIW discharge nozzle 352. In this way, a frozen film on the substrate W is thawed.

In the above two modifications, the high-temperature DIW discharge nozzle can be positioned at the retracted position also during the execution of the freezing process. Thus, it is also possible to continuously discharge the thawing liquid at a low flow rate as in the slow leak process in the low-temperature DIW discharge nozzle 41 instead of the pre-dispensing of discharging a fixed amount of the thawing liquid from the high-temperature DIW discharge nozzle at the retracted position immediately before the thawing process. As shown in these modifications, the invention can be applied to both the configuration for integrally moving the cooling gas discharge nozzle and the high-temperature DIW discharge nozzle and the configuration for individually moving these or the configuration for fixing one of these.

For example, in the above embodiment, the low-temperature DIW discharge nozzle 41 for supplying the low-temperature DIW to the substrate W to form the liquid film LP is provided at the position above and laterally retracted from the substrate W. However, a low-temperature DIW discharge nozzle may be, for example, provided on a pivotable arm similarly to the cooling gas discharge nozzle 51 and the like and may is moved to a position facing the substrate W to supply the low-temperature DIW.

For example, in the above embodiment, the slow leak process of the low-temperature DIW is continuously performed before and after the execution of the liquid film forming process. However, the slow leak process may be performed, for example, only before the execution of the liquid film forming process or may be intermittently performed.

Further, in the above embodiment, the slow leak flow rate is lower than the liquid film forming flow rate. However, it is not an essential requirement to achieve an object of supplying the DIW of a lower temperature than at the beginning to the substrate W, and the slow leak flow rate may be equal to or higher than the liquid film forming flow rate. In this case, for example, the posture of the low-temperature DIW discharge nozzle 41 may be made changeable and a discharging direction of the low-temperature DIW from the discharge port 41a can be set at a direction not oriented toward the substrate W during the slow leak process so that the low-temperature DIW is not supplied to the substrate surface Wf during the slow leak process. Besides, various measures can be taken such as by separately providing a member for blocking the arrival of the low-temperature DIW discharged from the discharge port 41a at the substrate surface Wf during the slow leak process.

Further, in the above embodiment, the low-temperature DIW discharged from the low-temperature DIW discharge nozzle 41 in the slow leak process is received by the receiving member 43. However, the low-temperature DIW discharged from the discharge port 41a in the slow leak process may land on such a position as not to pose any particular problem in the apparatus without providing the receiving member 43. Further, if no particular problem is posed, the low-temperature DIW discharged in the slow leak process may fall onto the substrate surface Wf.

Further, in the above embodiment, the low-temperature DIW discharge nozzle 41 is of a fixed type to be fixedly supported by the supporting member 42. However, the low-temperature DIW discharge nozzle 41 can also be made movable similarly to the other nozzles as described next.

Figure 11:
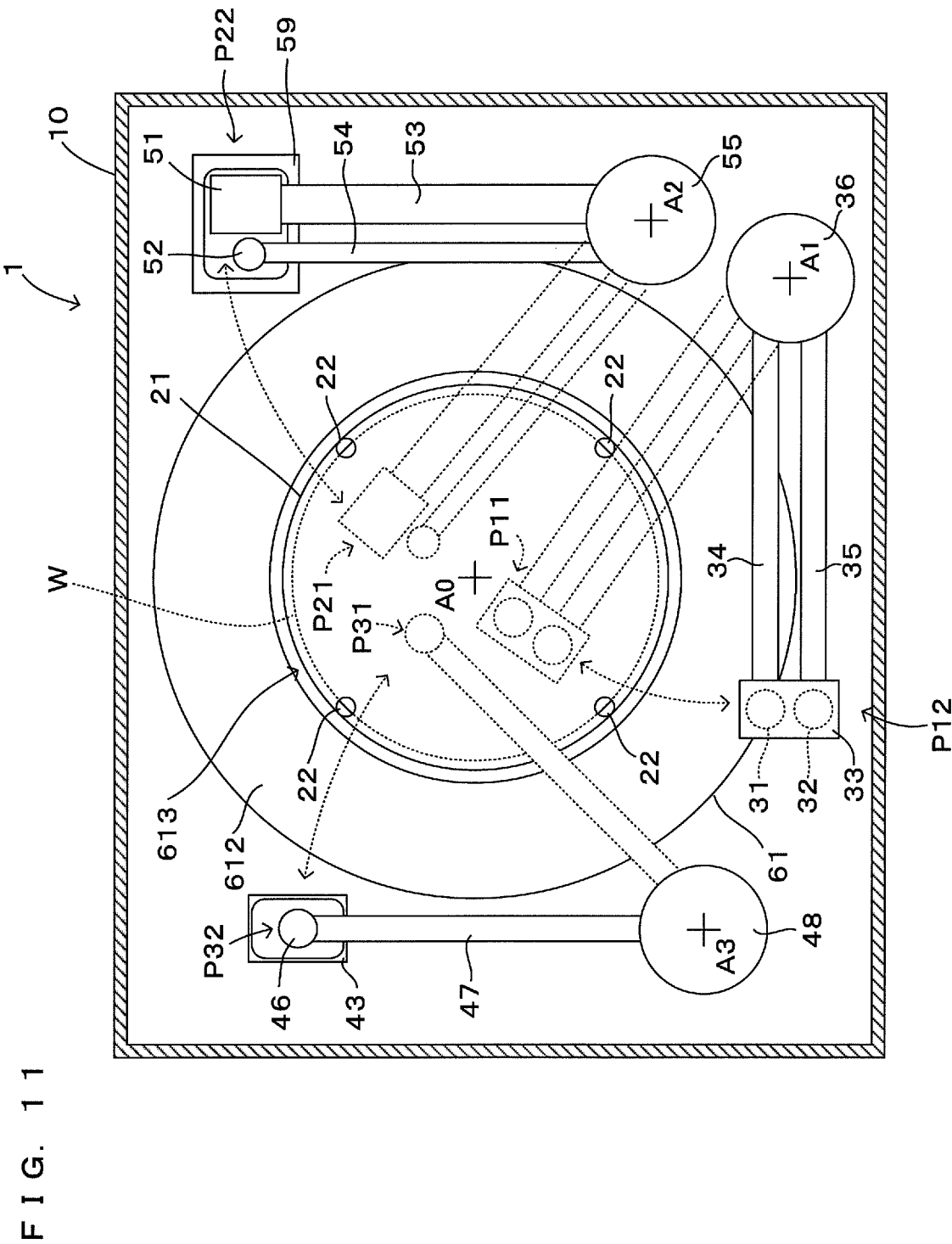
FIG. 11 is a plan view showing a modification of the low-temperature DIW discharge nozzle.

FIG. 11 is a plan view showing a modification of the low-temperature DIW discharge nozzle. As shown in FIG. 11, a low-temperature DIW discharge nozzle 46 is attached to a tip part of an arm 47 extending substantially in the horizontal direction, and a base end part of the arm 47 is connected to a rotary shaft 48 extending substantially in the vertical direction. An unillustrated arm rotating mechanism rotates the rotary shaft 48 about a center of rotation A3, whereby the low-temperature DIW discharge nozzle 46 is moved between a facing position P31 facing a substrate W and a retracted position P32 above and laterally retracted from the substrate W. Even if the low-temperature DIW discharge nozzle is configured as a movable nozzle in this way, the invention can be applied.

Specifically, the low-temperature DIW discharge nozzle 46 performs the slow leak process at the retracted position P32 and is, thereafter, moved to the facing position P31 after the discharge of the low-temperature DIW is temporarily stopped. At the facing position P31 facing the substrate W, the low-temperature DIW discharge nozzle 46 can form a liquid film LP on a substrate surface Wf by discharging the low-temperature DIW downward again. Note that the low-temperature DIW discharge nozzle 46 can be positioned at an arbitrary position facing the substrate W and the facing position P31 shown in FIG. 11 is an example thereof.

At this time, if the cooling gas discharge nozzle 51 is located above the vicinity of a center of the substrate W when the liquid film forming process is finished, it is preferable in avoiding the interference of the both nozzles to prevent the intersection of a movement path of the low-temperature DIW discharge nozzle 46 and that of the cooling gas discharge nozzle 51 as shown in FIG. 11. However, even if these movement paths intersect, the interference may be avoided by movement control timings. Alternatively, the interference of the both nozzles can be avoided by arranging the low-temperature DIW discharge nozzle 46 and the cooling gas discharge nozzle 51 at vertically spaced-apart positions.

Further, in the above embodiment, the cooling gas discharge nozzle 51 discharges the cooling gas at the freezing flow rate when moving from the retracted position P22 toward the position above the vicinity of the center of the substrate W. However, the flow rate of the cooling gas discharged during the above movement may be set at a flow rate other than the freezing flow rate (e.g. slow leak flow rate) or the discharge of the cooling gas may be stopped.

Further, in the above embodiment, the cooling gas discharge nozzle 51 faces the substrate W at the position above the vicinity of the center of the substrate W when the liquid film forming process is finished. However, if the cooling gas discharge nozzle 51 is facing the liquid film LP on the substrate surface Wf when the liquid film forming process is finished, the cooling gas can be discharged toward the liquid film LP immediately after the liquid film forming process even if the cooling gas discharge nozzle 51 is not necessarily moved to the position above the vicinity of the center of the substrate W. Further, it is not an essential requirement that the cooling gas discharge nozzle 51 faces the substrate W at the position above the liquid film LP on the substrate surface Wf when the liquid film forming process is finished, and the cooling gas discharge nozzle 51 may start moving from the retracted position P22 toward the position above the substrate W after the liquid film forming process.

Further, the substrate processing apparatus 1 of the above embodiment is an integrated processing apparatus for continuously performing the processes from the wet process using the chemical to the drying process after cleaning in the processing chamber 10. However, an object of application of the invention is not limited to this. The invention can be applied to substrate processing apparatuses in general at least provided with a configuration for forming a liquid film on a substrate W, freezing the liquid film and thawing and removing a frozen film.

This invention is applicable to substrate processing apparatuses and substrate processing methods in general for processing a substrate by forming a liquid film on the substrate, freezing the liquid film and removing the frozen film. Substrates to be processed include semiconductor wafers, glass substrates for photo mask, glass substrates for liquid crystal display, glass substrates for plasma display, substrates for FED, substrates for optical disc, substrates for magnetic disc, substrates for opto-magnetic disc and various other substrates.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing method, comprising:
    a holding step of holding a substrate in a horizontal posture by a spin chuck arranged in an internal space surrounded by a splash guard which surrounds a lateral periphery of the spin chuck;
    a liquid film forming step of forming a liquid film by supplying a liquid to an upper surface of the substrate in the internal space;
    a freezing step of freezing the liquid film by discharging cooling gas of a temperature lower than a freezing point of the liquid forming the liquid film to the liquid film by a cooling gas discharge nozzle at a facing position thereof, facing the upper surface of the substrate in the internal space; and
    a thawing step of discharging a heated thawing liquid supplied from a thawing liquid supplier via a pipe by a thawing liquid discharge nozzle at a facing position thereof, facing the upper surface of the substrate and thawing a frozen film formed by freezing the liquid film in the internal space,
    wherein:
    prior to the freezing step, the cooling gas in the pipe is discharged by the cooling gas discharge nozzle retracted to a retracted position of the cooling gas discharge nozzle, laterally retracted from the upper surface of the substrate and outside the splash guard;
    prior to the thawing step, the thawing liquid in the pipe is discharged by the thawing liquid discharge nozzle retracted to a retracted position of the thawing liquid discharge nozzle, laterally retracted from the upper surface of the substrate and outside the splash guard; and
    the cooling gas discharged from the cooling gas discharge nozzle at the retracted position of the cooling gas discharge nozzle and the thawing liquid discharged from the thawing liquid discharge nozzle at the retracted position of the thawing liquid discharge nozzle flow into a common flow passage disposed outside of the splash guard.

2. The substrate processing method according to claim 1, wherein the thawing step is executed after all the thawing liquid in the pipe between the thawing liquid supplier and the thawing liquid discharge nozzle is discharged by the thawing liquid discharge nozzle located at the retracted position of the thawing liquid discharge nozzle.

3. The substrate processing method according to claim 1, wherein the cooling gas is discharged by the cooling gas discharge nozzle located at the retracted position of the cooling gas discharge nozzle, during the execution of the liquid film forming step.

4. The substrate processing method according to claim 1, wherein:
    the cooling gas discharge nozzle and the thawing liquid discharge nozzle are integrally moved relative to the substrate; and
    after a predetermined amount of the thawing liquid is discharged by the thawing liquid discharge nozzle at the retracted position of the thawing liquid discharge nozzle, the freezing step is performed by the cooling gas discharge nozzle at the facing position of the cooling gas discharge nozzle and the thawing step is further performed by the thawing liquid discharge nozzle at the facing position of the thawing liquid discharge nozzle.

* * * * *